US006841931B2

(12) United States Patent
Takahashi et al.

(10) Patent No.: US 6,841,931 B2
(45) Date of Patent: Jan. 11, 2005

(54) LED LAMP

(75) Inventors: Yuji Takahashi, Nishikasugai-gun (JP); Koichi Kaga, Nishikasugai-gun (JP); Hideaki Kato, Nishikasugai-gun (JP); Tadaaki Ikeda, Hioki-gun (JP); Michio Miyawaki, Sendai (JP)

(73) Assignees: Toyoda Gosei Co., Ltd., Aichi (JP); Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 10/119,951

(22) Filed: Apr. 11, 2002

(65) Prior Publication Data

US 2002/0149314 A1 Oct. 17, 2002

(30) Foreign Application Priority Data

Apr. 12, 2001 (JP) .................................... P2001-113447
Jun. 27, 2001 (JP) .................................... P2001-194269

(51) Int. Cl.[7] .................................................. H01J 1/62
(52) U.S. Cl. .................... 313/500; 315/169.1; 313/499
(58) Field of Search .......................... 315/169.1, 169.3; 313/498, 499, 500, 512; 257/99, 100, 676

(56) References Cited

U.S. PATENT DOCUMENTS

| | | | | |
|---|---|---|---|---|
| 3,875,473 A | | 4/1975 | Lebailly | 315/169 |
| 6,121,637 A | * | 9/2000 | Isokawa et al. | 257/99 |
| 6,445,011 B1 | * | 9/2002 | Hirano et al. | 257/99 |
| 6,519,394 B2 | * | 2/2003 | Kondo et al. | 385/51 |

FOREIGN PATENT DOCUMENTS

| | | | | |
|---|---|---|---|---|
| DE | 2 315 709 | | 3/1973 | |
| DE | 41 07 526 C2 | | 3/1991 | |
| EP | 0 397 393 A2 | | 5/1990 | |
| EP | 1 030 377 A2 | | 8/2000 | |
| JP | 60-147178 A | | 8/1985 | |
| JP | 60147178 A | * | 8/1985 | H01L/33/00 |
| JP | 06-310763 A | | 11/1994 | |
| JP | 09-321341 A | | 12/1997 | |

OTHER PUBLICATIONS

German Office Action dated Feb. 12, 2003 with English Translation.

* cited by examiner

*Primary Examiner*—Don Wong
*Assistant Examiner*—Jimmy T Vu
(74) *Attorney, Agent, or Firm*—McGinn & Gibb, PLLC

(57) ABSTRACT

In an LED lamp, a Zener diode is mounted on a copper plate, and a GaN-based light-emitting element is mounted on the Zener diode with an electrode of the element being oriented facedown. Two Zener diodes close to the center of the LED lamp are mounted on a common copper plate, thereby interconnecting the two light-emitting elements in series. Consequently, a Zener diode is connected to the respective two Zener diodes by means of a wire serving as a conductive member. Four light-emitting elements are connected in series, so that four light-emitting elements are connected in series, thus completing a circuit configuration. In this way, use of the Zener diodes for interconnection purpose enables a reduction in the number of minimum required wires. It is better to connect the wire to the upper surfaces of the Zener diodes, thereby obviating a necessity for a redundant wire space and enabling miniaturization of the LED lamp.

31 Claims, 11 Drawing Sheets

101 102 103 102 103 102 103 102 103 104 105 104 105 104

LED LAMP

The present application is based on Japanese Patent Applications No. 2001-113447 and 2001-194269, which are incorporated herein by reference.

BACKGROUND OF THE INVENTION

1. Field of the Invention

The present invention relates to a light-emitting diode lamp (hereinafter abbreviated as an "LED lamp"), wherein a plurality of light-emitting elements, a wiring sub-mount for electrically interconnecting the light-emitting elements, and a wire are housed in a case made of synthetic resin or the like and sealed with material, such as translucent, transparent epoxy resin. Throughout the specification, an LED chip itself is called a "light-emitting element," and the entirety of a light-emitting device having a plurality of LED chips mounted thereon is called a "light-emitting diode lamp" or an "LED lamp."

2. Description of the Related Art

At the time of designing of an LED-applied product, in terms of optics it is preferable to design an LED so as to become as much close to a point light source as possible. Miniaturization of an LED lamp into an SMD (Surface Mount Device)-type package, such as a 2-in-1 (two light-emitting elements are housed in one package), a 3-in-1 (three light-emitting elements in one package), and a 4-in-1 (four light-emitting elements are housed in one package) has been under study.

When an attempt is made to connect a plurality of GaN-based light-emitting elements in series and seal the elements in a single package, a plurality of gold wires for interconnection purpose are required. Further, there is needed a space for interconnecting the gold wires, thus posing difficulty in miniaturization of the package. If an LED is miniaturized, the heatsinking performance of the LED will become worse. As a result, the light-emitting elements become hot, thus the worsening luminous efficiency of the LED lamp.

Further, the LED lamp of SMD package type has hitherto been employed as a light source for backlighting purpose. The lamp is manufactured by means of laying a plurality of metal leads in a case which is formed from synthetic resin through injection molding; connecting a plurality of light-emitting elements to one of the leads; electrically connecting the light-emitting elements to other leads through wire bonding; and sealing the entire case with transparent epoxy resin or the like. One example of such a related-art LED lamp will now be described by reference to FIGS. 12A, 12B, and 13.

As shown in FIG. 12A, an LED lamp 51 is constituted of a case 52 made of synthetic resin, and one metal lead 53 is inserted into an upper half of an opening section 52*a* of the case 52 and extends from the left end of the opening section 52*a* across to the right end thereof. A total of five light-emitting elements are mounted on the lead 53; namely, two red light-emitting elements R1, R2; two green light-emitting elements G1, G2; and one blue light-emitting element B1. Five leads 54*a*, 54*b*, 54*c*, 54*d*, and 54*e* are inserted into a lower half of the opening section 52*a* of the case 52 while being spaced away from the lead 53. The leads 53 and 54*a* through 54*e* and the case 52 are formed into one piece, by means of setting the leads 53 and 54*a* through 54*e* in a die to be used for injection molding the case 52, and subjecting the case 52 to insertion molding.

The five light-emitting elements are electrically connected together in the following manner. Since anode electrodes of the red light-emitting elements R1, R2 are provided on the reverse sides thereof, the red light-emitting elements R1, R2 are mounted on the lead 53 by means of a silver paste, whereby the anode electrodes of the red light-emitting elements R1, R2 are connected to the lead 53. Cathode electrodes of the red light-emitting elements R1, R2 are provided on the front side thereof. Hence, the element R1 is bonded to the lead 54*a* with a wire 55, and the element R2 is bonded to the lead 54*e* with a wire 55. Meanwhile, the GaN-based green light-emitting elements G1, G2 and the blue light-emitting element B1 have cathode and anode electrodes on their front sides. All the anode electrodes of the elements G1, G2, and B1 are bonded to lower projections of the lead 53 with wires 55. The cathode electrodes of the elements G1, G2, and B1 are bonded to the leads 54*b*, 54*c*, and 54*d* with wires 55. As shown in FIG. 12B, the opening section 52*a* of the case 52 is filled and sealed with transparent epoxy resin 56.

FIG. 13 shows electrical connection of the thus-connected five light-emitting elements in the form of a circuit diagram. As shown in FIG. 13, the LED lamp 51 has an anode common circuit which takes the lead 53 as an anode terminal. Such an electrical circuit enables a decrease in the number of terminals, thereby miniaturizing the LED lamp 51.

In relation to such an LED lamp, particularly an LED lamp for backlighting purpose, strong demand exists for an LED having a lower-profile opening of a case, a lower-profile of the outside shape of the lamp, higher intensity, and superior heatsink performance. In contrast, in order to realize an anode-common circuit, the related-art LED lamp 51 requires a large wire space. To this end, the thickness of the opening section (i.e., the longitudinal length) is made large. As shown in FIG. 12B, the lower leads 54*a* through 54*e* must be folded backward. At this time, if a portion 52*b* supporting the lead 54 of the case 52 is thin, the portion 52*b* becomes prone to cracking. Hence, the portion 52*b* supporting a lead must have a certain minimum thickness. Consequently, the entire outside shape of the case 52 has become thick. Since all the light-emitting elements R1, R2, G1, G2, and B1 are mounted on one lead 53, there is no alternative but to dissipate the heat produced by the light-emitting elements by way of the lead 53. Thus, the LED lamp involves a problem even in terms of heat dissipation.

SUMMARY OF THE INVENTION

The present invention provides an LED lamp which can be miniaturized and slimmed down, and is superior in heatsinking performance and intensity by means of diminishing the number of conductive members, including wires for interconnection purpose.

An LED lamp according to a first invention comprises: sub-mounts for interconnection purpose to be used for mounting a plurality of light-emitting elements; and a conductive member, wherein the light-emitting elements are electrically connected by way of one electrode of each of the elements and by way of the sub-mounts, and electrically-unconnected electrodes of the respective light-emitting elements are connected together, by way of the sub-mounts and through use of a conductive member.

In relation to the LED lamp having the foregoing configuration, the light-emitting elements are electrically connected by way of one electrode of each of the elements and by way of the sub-mounts. Hence, the number of conductive members to be used for connecting the light-emitting elements can be diminished. Remaining electrodes of the respective light-emitting elements are connected together, by way of the sub-mounts and through use of a conductive member, whereby all the light-emitting elements are connected together in series. Thus, additional space to be used for connecting the conductive members is not required at all, thereby miniaturizing the entirety of the LED lamp. Further, in contrast with a related-art LED lamp in which all light-emitting elements are mounted on a single lead, the light-emitting elements are mounted on separate sub-mounts for interconnection purpose. Hence, the heatsinking performance of the LED lamp is improved considerably. There can be prevented occurrence of a sharp drop in the luminous efficiency of even a red light-emitting element, which would otherwise be caused at a high temperature, thereby contributing to an increase in the intensity of the LED lamp. Since all the light-emitting elements are connected in series, the burden of designing a drive circuit is lessened.

In this way, the LED lamp is miniaturized, and there is provided an LED lamp whose drive circuit is easy to design and which has superior heatsinking performance.

According to a second invention, an LED lamp of the first invention is characterized in that the light-emitting elements are mounted on the sub-mounts in a one-to-one correspondence.

In contrast with a related-art LED lamp in which all light-emitting elements are mounted on a single lead, the light-emitting elements are mounted on separate sub-mounts for interconnection purpose. Hence, the heatsinking performance of the LED lamp is improved considerably. There can be prevented occurrence of a sharp drop in the luminous efficiency of even a red light-emitting element, which would otherwise be caused at a high temperature, thereby contributing to an increase in the intensity of the LED lamp.

According to a third invention, an LED lamp of the first or second invention is characterized in that the plurality of light-emitting elements, the sub-mounts, and the conductive members are sealed in a package with translucent material.

When the light-emitting elements are sealed with translucent material in this way, the light extracted from the light-emitting elements becomes about double an LED lamp whose light-emitting elements are not sealed. Deterioration of the light-emitting elements, that of the sub-mounts, and that of the conductive member are prevented by means of sealing. As a result of the light-emitting elements, the sub-mounts, and the conductive members being assembled into a package, there is provided an LED lamp which is easily applied to various products.

According to a fourth invention, an LED lamp of any of the first through third inventions is characterized in that the sub-mounts connected together by way of the conductive members are reversed in polarity to each other.

The light-emitting elements are mounted on the sub-mounts while their electrodes are oriented facedown. The sub-mounts which are reversed in polarity to each other are connected together. As a result, the light-emitting elements are connected in series with each other. The remaining electrodes are connected together by way of the sub-mounts and through use of the conductive members, thus completing a series connection between the light-emitting elements.

By means of such a configuration, the number of conductive members to be used for connecting the light-emitting elements can be diminished, and additional space to be used for connecting the conductive members is not required at all, thereby miniaturizing the entirety of the LED lamp. Further, in contrast with a related-art LED lamp in which all light-emitting elements are mounted on a single lead, the light-emitting elements are mounted on separate sub-mounts for interconnection purpose. Hence, the heatsinking performance of the LED lamp is improved. There can be prevented occurrence of a sharp drop in the luminous efficiency of even a red light-emitting element, which would otherwise be caused at a high temperature, thereby contributing to an increase in the intensity of the LED lamp. Since all the light-emitting elements are connected in series, the burden of designing a drive circuit is lessened.

The LED lamp is miniaturized in this way, and there is provided an LED lamp whose drive circuit is easy to design and which has superior heatsinking performance.

According to a fifth invention, an LED lamp of the fourth invention is characterized in that the sub-mounts are Zener diodes.

Consequently, the light-emitting elements are protected from abrupt voltage changes, because the light-emitting elements are mounted on the Zener diodes. Thus, an LED lamp becomes stable.

According to a sixth invention, an LED lamp of the first through third inventions is characterized in that the sub-mounts correspond to conductive substrates.

Consequently, the light-emitting elements are mounted on the sub-mounts while their electrodes are oriented facedown. The sub-mounts are connected together, thereby connecting the light-emitting elements in series. Hence, the remaining electrodes are connected together through use of the conductive members, thus completing a series connection between the light-emitting elements. Hence, the number of conductive members to be used for connecting the light-emitting elements can be diminished, and additional space to be used for connecting the conductive members is not required at all, thereby miniaturizing the entirety of the LED lamp. Further, in contrast with a related-art LED lamp in which all light-emitting elements are mounted on a single lead, the light-emitting elements are mounted on separate sub-mounts for interconnection purpose. Hence, the heatsinking performance of the LED lamp is improved. There can be prevented occurrence of a sharp drop in the luminous efficiency of even a red light-emitting element, which would otherwise be caused at a high temperature, thereby contributing to an increase in the intensity of the LED lamp. Since all the light-emitting elements are connected in series, the burden of designing a drive circuit is lessened.

The LED lamp is miniaturized in this way, and there is provided an LED lamp whose drive circuit is easy to design and which has superior heatsinking performance.

An LED lamp according to a seventh invention comprises: seats which are provided on two leads and correspond to two sub-segments into which a concave reflection mirror is split; single diodes which are mounted on bottom surfaces of the respective seats and are reversed in polarity to each other; single light-emitting elements which are mounted on the respective single diodes; conductive members for interconnecting upper surfaces of the single diodes; and a translucent material which seals upper portions of the two leads, the single diodes, and the single light-emitting elements, and the conductive members, wherein a convex lens is molded in an upper part of the translucent material.

Even in such a round-type LED lamp of discrete type, light-emitting diodes are mounted on diodes which are reversed in polarity to each other while electrodes of the light-emitting elements are oriented facedown. Electrical connection between the light-emitting elements can be established by means of interconnecting upper surfaces of the diodes through use of one conductive member. Hence, two light-emitting elements can be mounted on two seats into which a concave reflection mirror is split. Hence, there can be readily produced a round-type LED lamp having brightness about twice that of a related-art LED lamp. Two light-emitting elements are mounted on upper ends of separated leads, and hence the light-emitting elements are superior in heatsinking performance.

In this way, there is provided an LED lamp which is about twice in brightness that of a related-art round-type LED lamp, superior in heatsinking performance, and can prevent occurrence of a drop in luminous efficiency.

An LED lamp according to an eighth invention, comprises: single diodes which are mounted on a pair of plate-like leads and reversed in polarity to each other; single light-emitting elements mounted on the respective single diodes; a conductive member for interconnecting upper surfaces of the single diodes; and sealing material which seals extremities of the pair of plate-like leads, the single diodes, the single light-emitting elements, and the conductive member, wherein the pair of plate-like leads are bent at substantially a right angle along side surfaces and a bottom surface of the sealing material.

As a result, two light-emitting elements are housed in one miniaturized plastic-sealed package which does not require a space for redundant conductive members. Hence, there is provided an LED lamp which has brightness about twice that of a related-art LED lamp and can be subjected to surface mounting. Further, light-emitting elements are mounted on the leads in a one-to-one correspondence, and hence the LED lamp is also superior in heatsinking performance.

In this way, there is provided an LED lamp which is bright about twice as a related-art surface-mount-type LED lamp, superior in heatsinking performance, and can prevent a drop in light-emitting efficiency.

According to a ninth invention, an LED lamp of the seven or eighth invention is characterized in that the diodes are Zener diodes.

Consequently, the light-emitting elements are protected from abrupt voltage changes, because the light-emitting elements are mounted on the Zener diodes. Thus, an LED lamp becomes stable.

A tenth invention provides an LED lamp having a case in which a plurality of light-emitting elements are sealed with translucent material, the lamp comprising: a plurality of independent, conductive leads (first lead) to be used for mounting the light-emitting elements, wherein upper ends of the leads are caught and held by an upper end of the case, and lower ends of the leads are caught and held by a lower end of the case so as to project beyond a lower surface of the case; additional single leads (second lead) to be provided at respective sides of the leads or atone side of the leads, wherein upper ends of the additional single leads are caught and held by the upper end of the case, and lower ends of the additional single leads are caught and bent by the lower end of the case so as to project beyond the lower surface of the case; and a wire which is bonded to anodes or cathodes of the respective light-emitting elements and is at one end bonded to the additional single leads, thereby constituting an anode common or cathode common circuit configuration. Hereupon, the case and the leads correspond to the package and the conductive member in the LED lamp of the first invention.

In relation to the LED lamp having the foregoing configuration, the plurality of conductive leads to be used for mounting the light-emitting elements and the additional single leads provided at one or both sides of the leads are caught and held at upper ends thereof by the upper end of the case and at lower ends thereof by the lower end of the case. Load—which is imposed when the leads are bent backward of the case—can be received by two areas: namely, the upper and lower ends of the case. As a result, even when the lower end portion of the case is made thin, the case can sufficiently withstand the load without involvement of cracking. Hence, the outside shape of the case can be made slim.

An anode common or cathode common circuit configuration for miniaturizing an LED lamp by means of diminishing the number of terminals is embodied by means of bonding together anode or cathode sides of the light-emitting elements one after another through use of a wire, and bonding the ends of the wire to the respective additional single leads. Hence, there is obviated a necessity for a wire space for fulfilling an anode or cathode common circuit. Hence, the opening section of the case can be made slim. In association with a reduction in the thickness of the lower end of the case, the outside shape of the case can be made more slim.

Since metal leads to be used for mounting the light-emitting elements are independent of each other, the LED lamp according to the invention becomes superior in heat dissipation to a related-art LED lamp in which all light-emitting elements are mounted on a single lead. As a result, there can be prevented occurrence of a drop in luminous efficiency, which would otherwise arise in a red light-emitting element or the like whose luminous efficiency drops sharply at high temperature, thus contributing to enhancement of intensity of the LED lamp.

As mentioned above, there can be realized an LED lamp which enables slimming down of an opening section of a case, slimming down of an outside shape of the case, higher intensity, and superior heatsink performance.

According to an eleventh invention, an LED lamp of the tenth invention is characterized in that the lower ends of the leads, except for the lower ends of the leads disposed at both lateral ends, project beyond the lower surface of the case and are further bent and extend along a back surface of the case; and wherein the lower ends of the additional single leads projecting beyond the lower surface of the case are bent so as to extend laterally, and the lower ends of the additional single leads protrude along both side surfaces of the case.

As mentioned above, the lower ends of the leads, except for the lower ends of the leads disposed at both lateral ends, project beyond the lower surface of the case and are further bent and extend along a back surface of the case, and the lower ends of the additional single leads projecting beyond the lower surface of the case are bent so as to extend laterally, and the lower ends of the additional single leads protrude along both side surfaces of the case. Hence, the LED lamp is positioned at both ends thereof when being mounted on a board by means of soldering or the like, and hence the LED lamp remains stationary, thus ensuring mounting precision.

In this way, there can be realized an LED lamp which enables slimming down of an opening section of a case, slimming down of an outside shape of the case, higher intensity, and superior heatsink performance, and which facilitates a mounting job.

According to a twelfth invention, an LED lamp of the tenth or eleventh invention is characterized in that the light-emitting elements comprise at least one red light-emitting element, one green light-emitting element and one blue light-emitting element.

As mentioned above, light-emitting elements of the primary colors; that is, a red light-emitting element, a green light-emitting element, and a blue light-emitting element, are used for constituting an LED lamp. The LED lamp emits white light and hence can be used as a light source for backlighting purpose. Since the opening section of the case and the outside shape of the case are slimmed down, the efficiency of entrance of light into a light guide plate to be used for backlighting is also improved, thereby contributing to an improvement in the intensity of backlight.

In this way, there can be realized an LED lamp which enables slimming down of an opening section of a case, slimming down of an outside shape of the case, higher intensity, and superior heatsink performance, and which enables an improvement in intensity as backlight.

According to a thirteenth invention, the LED of any one of the tenth through twelfth inventions is characterized in that the light-emitting elements comprise two red light-emitting elements, two green light-emitting elements, and one blue light-emitting element.

Since the red and green light-emitting elements are lower in intensity than the blue light-emitting element, a balance between three colors can be achieved by use of two red light-emitting elements and two green light-emitting elements, where by white light can be produced in a balanced state of thermal load. Since the green light-emitting element is superior in luminous efficiency to the blue light-emitting element, the green light-emitting element is suitable for an application which requires greenish white light or an application in which low power is desired.

In this way, there can be realized an LED lamp which enables slimming down of an opening section of a case, slimming down of an outside shape of the case, higher intensity, and superior heatsink performance, and which is suitable for use in an application requiring greenish white light or an application in which low power is desired.

According to a fourteenth invention, the LED lamp of tenth to twelfth inventions is characterized in that the light-emitting elements comprise two red light-emitting elements, one green light-emitting element, and two blue light-emitting elements.

Use of two blue light-emitting elements results in generation of bluish white light with a balanced thermal load. Hence, there is manufactured an LED lamp optimal for an application which requires bluish white light.

In this way, there can be realized an LED lamp which enables slimming down of an opening section of a case, slimming down of an outside shape of the case, higher intensity, and superior heatsink performance, and which is suitable for use in an application requiring bluish white light.

According to a fifteenth invention, the LED lamp of twelfth through fourteenth inventions is characterized in that the red light-emitting element is mounted to the lead while an anode or cathode side of the element is taken as an upper surface, and the green and blue light-emitting elements are connected to two electrodes provided on the tops of respective Zener diodes mounted on the lead, through use of gold bumps.

The green and blue light-emitting elements are connected to two electrodes provided on the tops of respective Zener diodes mounted on the lead, through use of gold bumps while electrode sides of the elements are oriented facedown. An anode or cathode common circuit can be achieved by means of bonding a wire to the tops of the Zener diodes. Hence, there is obviated a necessity for a large wire space, thereby slimming down the thickness of the opening section of the case. In association with slimming down of the lower end of the case, the outside shape of the case can be made more slim. Furthermore, sapphire substrates of the green and blue light-emitting elements, which are reversed to the electrode sides thereof, are taken as upper sides. As a result, the green and blue light-emitting elements are higher in intensity than in a case where transparent electrode sides of the green and blue light-emitting elements are taken as upper surfaces, thereby enhancing the overall intensity of the LED lamp.

In this way, there can be realized an LED lamp which enables slimming down of an opening section of a case, slimming down of an outside shape of the case, higher intensity, and superior heatsink performance.

According to a sixteenth invention, an LED lamp of the fifteenth invention is characterized in that the red light-emitting element is mounted on the lead while an anode side of the element is taken as an upper surface.

Since the anode side of the red light-emitting element is higher in intensity than the cathode side of the same, the red light-emitting element is mounted while the anode side thereof is taken as an upper surface. As a result, the overall intensity of the LED lamp can be enhanced.

In this way, there can be realized an LED lamp which enables slimming down of an opening section of a case, slimming down of an outside shape of the case, higher intensity, and superior heat-sink performance.

DETAILED DESCRIPTION OF THE PREFERRED EMBODIMENTS

Embodiments of the invention will be described hereinbelow by reference to the accompanying drawings.

First Embodiment

A first embodiment of the invention will now be described by reference to FIGS. 1 and 2.

Figure 1A:
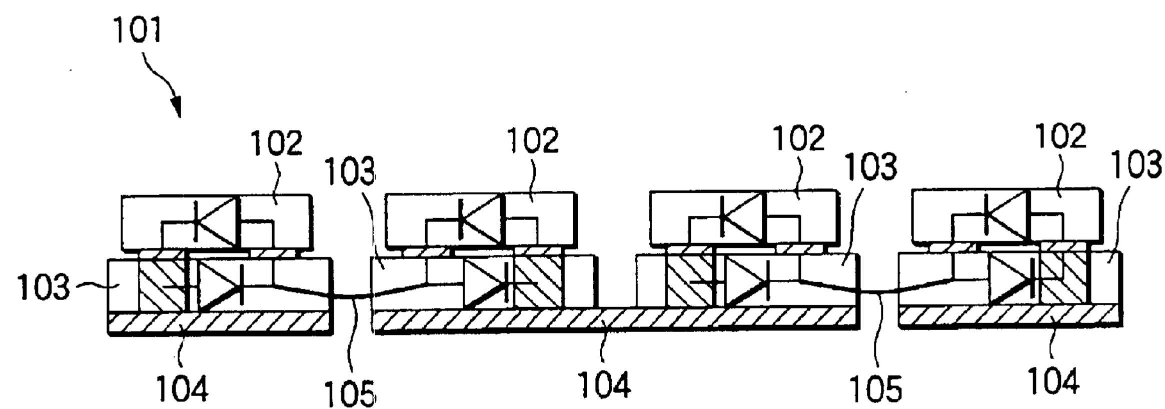
FIG. 1A is a longitudinal cross-sectional view schematically showing a circuit configuration of an LED lamp according to the first embodiment.
Figure 1B:
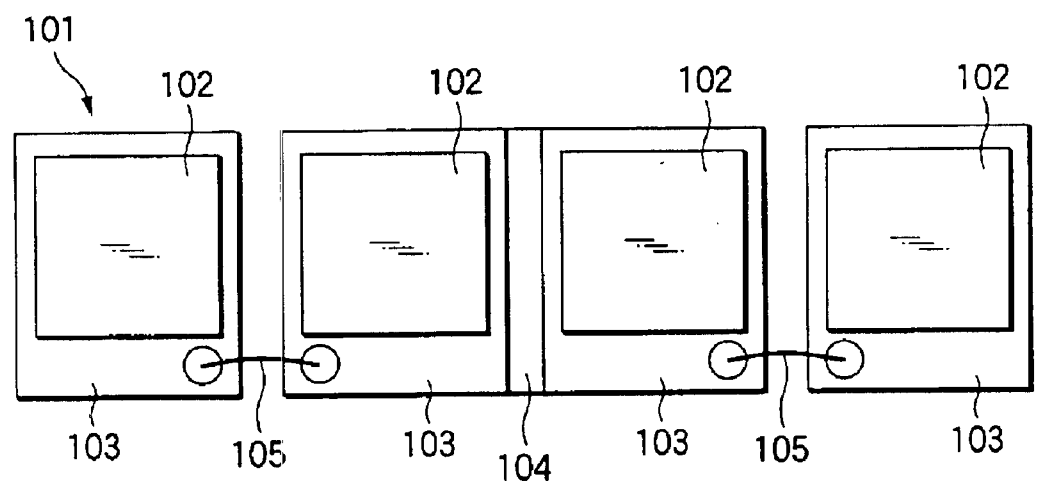
FIG. 1B is a plan view showing the entire configuration of the LED lamp.
Figure 2:
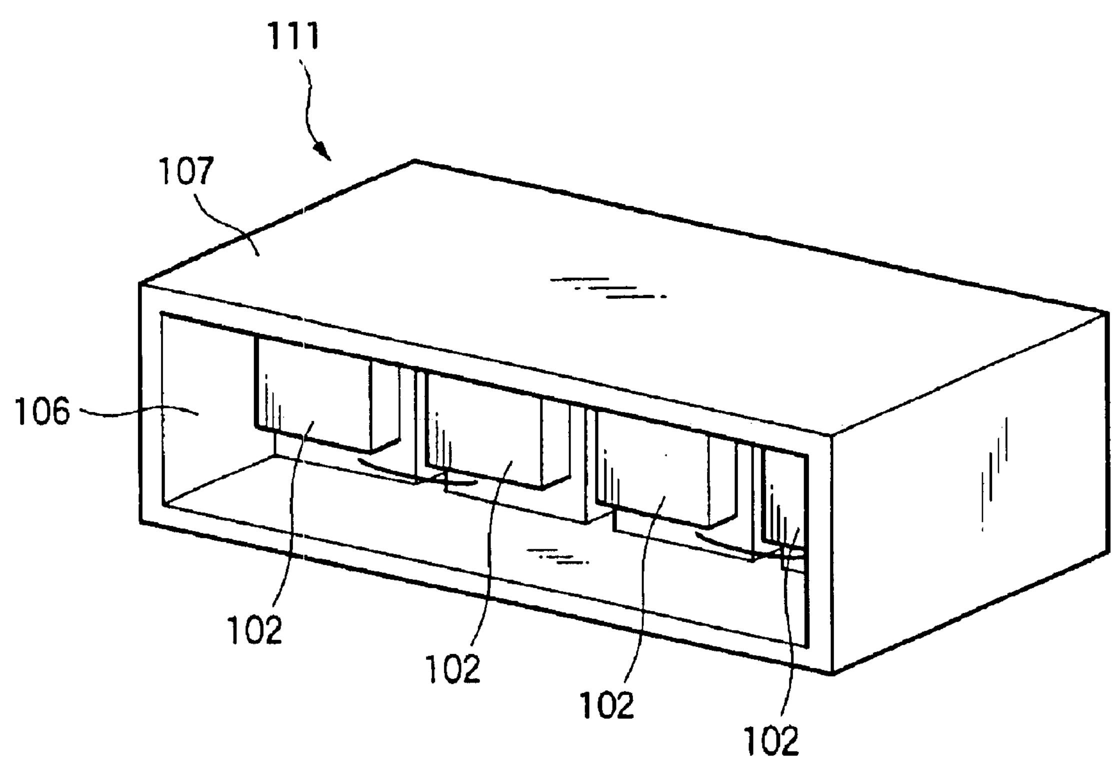
FIG. 2 is a perspective view showing an LED lamp of SMD package type to which the LED lamp according to the first embodiment has been applied.

As shown in FIG. 1A, the circuit of the LED lamp 101 according to the first embodiment is constituted by means of connecting four GaN-based light-emitting elements 102 in series. Specifically, a Zener diode 103 is mounted on a copper plate 104, and a GaN-based light-emitting element 102 is mounted on the Zener diode 103 with an electrode of the element being oriented facedown. Here, adjacent Zener diodes 103 are reversed in polarity to each other. Further, two Zener diodes 103 close to the center of the LED lamp 101 are mounted on a common copper plate 104, thereby interconnecting the two light-emitting elements 102 in series. Consequently, a Zener diode 103 is connected to the respective two Zener diodes 103 by means of a wire 105 serving as a conductive member. Four light-emitting elements 102 are connected in series, so that four light-emitting elements 102 are connected in series, thus completing a circuit configuration.

In the LED lamp 101 according to the first embodiment of the invention, the Zener diodes 103 serving as sub-mounts are used for interconnection purpose, thereby diminishing the number of minimum required wires 105. It is better to connect the wire 105 to the upper surfaces of the Zener diodes 103, thereby obviating a necessity for a redundant wire space and enabling miniaturization of the LED lamp 101. In order to illuminate the LED lamp 101, power is supplied to the copper plates 104 disposed on both sides of the common copper plate 104. The four light-emitting elements 102 are mounted on the upper surfaces of separate Zener diodes 103. Hence, the heatsinking performance of the LED lamp1 is improved. Further, even when the light-emitting elements 102 become hot, the luminous efficiency of the light-emitting elements 102 will no become drop.

The LED lamp 101 according to the first embodiment is built into an SMD package 107 formed from synthetic resin through injection molding. The light-emitting elements 102 are sealed with transparent epoxy resin (translucent material) 106, thereby constituting an LED lamp 11 shown in FIG. 2. A concentrated light source is used primarily for backlighting liquid-crystal. Since the height of the SMD package 107 is reduced as a result of miniaturization, there is improved an efficiency of entrance of light into a transparent acrylic plate which guides the light originating from the LED lamp 111 to the reverse side of liquid-crystal, thereby realizing bright backlight.

A method of producing white light for backlighting purpose from the LED lamp 111 includes several methods: namely, a method in which two of the four light-emitting elements 102 are constituted of GaAs-based red light-emitting elements, and the remaining inner two light-emitting elements 102 are embodied as a combination of a GaN-based blue light-emitting element and a GaN-based green light-emitting element; a method in which four GaN-based blue light-emitting elements and fluorescent material—which emits yellow light upon exposure to radiation of the blue light-emitting elements—are used in combination; and a method in which four light-emitting elements 102 are constituted of UV-ray light-emitting elements, and three types of fluorescent materials—which emit light of primary colors: that is, red light, yellow light, and blue light, upon exposure to UV rays—are placed in front of the light-emitting elements 102.

Second Embodiment

A second embodiment of the invention will now be described by reference to FIGS. 3A and 3B.

Figure 3A:
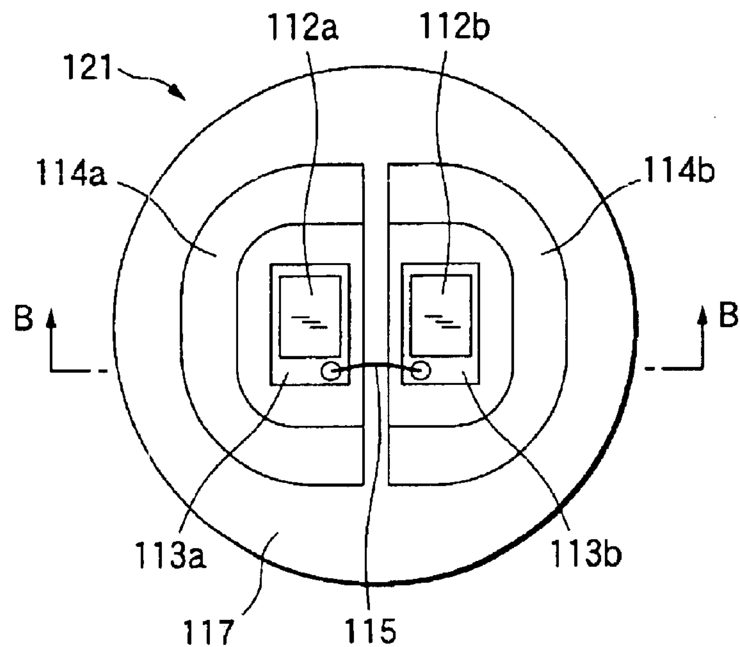
FIG. 3A is a plan view showing the configuration of an overall LED lamp according to the second embodiment.
Figure 3B:
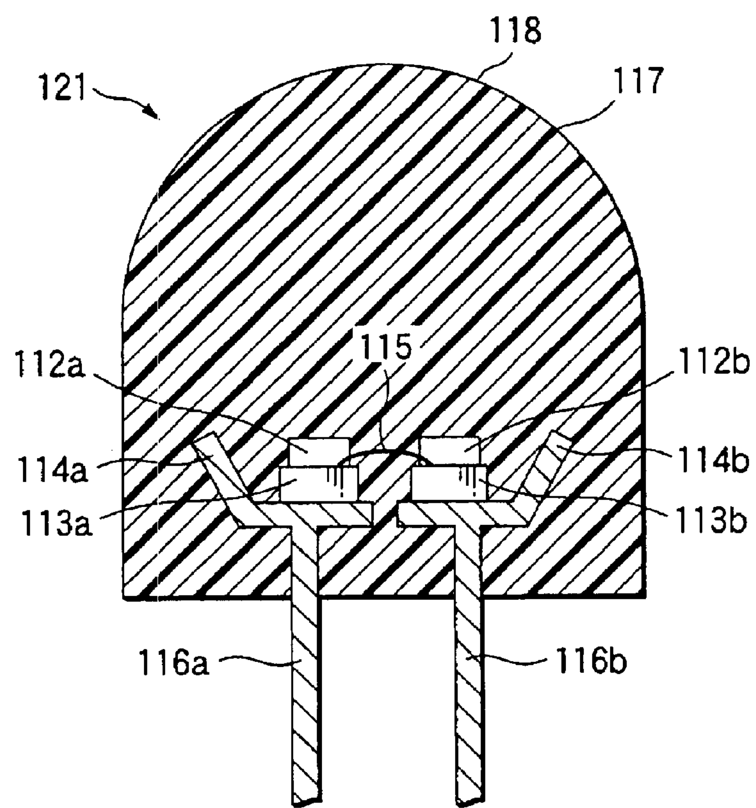
FIG. 3B is a cross-sectional view taken along line B—B shown in FIG. 3A.

As shown in FIGS. 3A and 3B, in relation to an LED lamp 121 according to the second embodiment, seats 114*a*, 114*b*—which assume a two-way split concave reflector—are provided at upper ends of the two upright leads 116*a*, 116*b*. A Zener diode 113*a* is mounted on the bottom surface of the seat 114*a*, and a Zener diode 113*b* is mounted on the bottom surface of the seat 114*b*. The polarity of one of the Zener diodes 113*a*, 113*b* is reversed. The GaN-based blue light-emitting elements 112*a*, 112*b* are mounted on the Zener diodes 113*a*, 113 with their electrodes being oriented facedown. The wire 115 is bonded to the upper surfaces of the Zener diodes 113*a*, 113*b*, thereby interconnecting the light-emitting elements 112*a*, 112*b* in series. Upper portions of the leads 116*a*, 116*b*, the seats 114*a*, 114*b*, the Zener diodes 113*a*, 113*b*, the light-emitting elements 112*a*, 112*b*, and the wire 115 are sealed with transparent epoxy resin 117 serving as translucent material. Further, a convex lens 118 serving as an optical radiation plane is molded.

When power is supplied by way of the two leads 116*a*, 116*b*, an electric current flows into the light-emitting elements 112*a*, 112*b* in series, whereupon the light-emitting elements 112*a*, 112*b* illuminate. The light emanated from the side surfaces of the light-emitting elements 112*a*, 112*b* is subjected to upward reflection performed by the concave reflection mirrors 114*a*, 114*b* which are split into two parts. The thus-reflected light is converged and emanated outward by a convex lens 118 formed from transparent epoxy resin 117. Such a so-called round-type LED lamp has hitherto been available. The LED lamp 121 according to the second is equipped with the two light-emitting elements 112*a*, 112*b* by means of reducing an interconnection space. hence, Light which is about twice in quantity the light emanated from the related-art round-type LED lamp can be radiated externally. Since the two light-emitting elements 112*a*, 112*b* are mounted on the separate leads 116*a*, 116*b*, the LED lamp 121 is superior in heatsinking performance. Further, there can be prevented occurrence of a drop in luminous efficiency, which would otherwise be caused when the light-emitting elements 112*a*, 112*b* have become hot.

In this way, the LED lamp 121 according to the second embodiment is bright about twice a related-art shell-type LED lamp and superior in heatsinking performance, thus preventing occurrence of a drop in luminous efficiency.

Third Embodiment

A third embodiment of the invention will now be described by reference to FIGS. 4A and 4B.

Figure 4A:
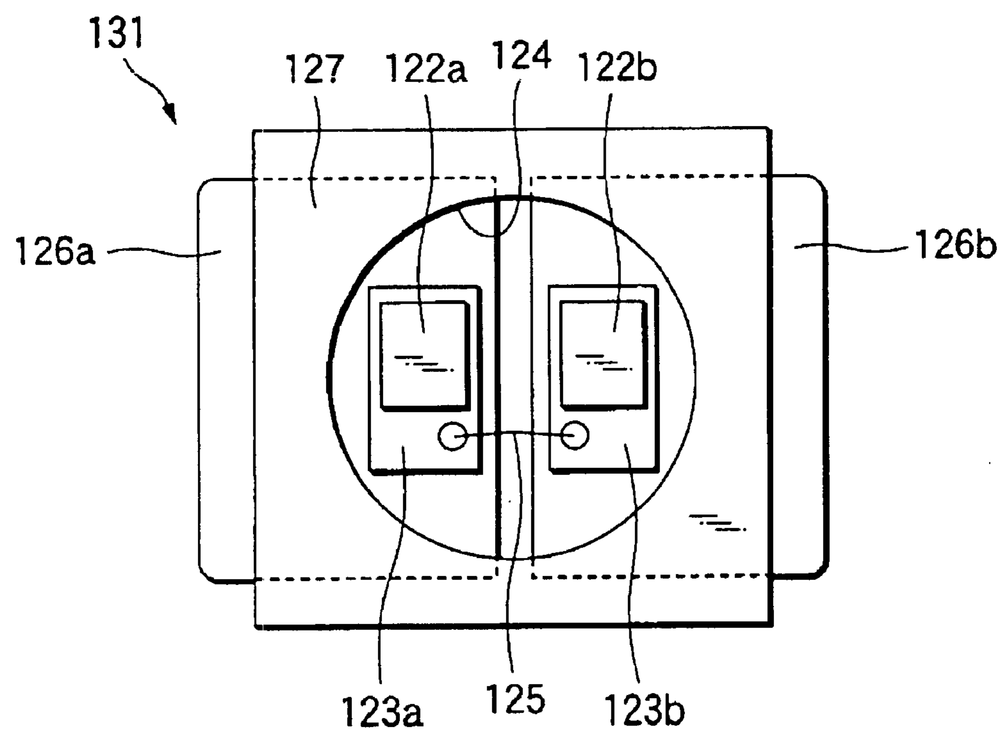
FIG. 4A is a plan view showing the configuration of an overall LED lamp according to the third embodiment.
Figure 4B:
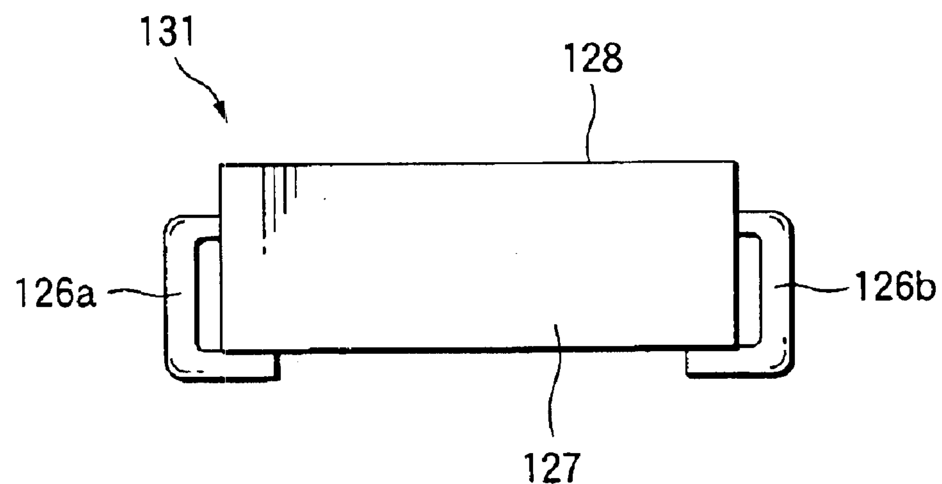
FIG. 4B is a side view of the LED.

As shown in FIGS. 4A and 4B, in relation to an LED lamp 131 according to the third embodiment, a pair of plate-like leads 126*a*, 126*b* are sealed with transparent epoxy resin 127 serving as sealing material while extremities of the leads 126*a*, 126*b* are spaced apart from each other. Here, the transparent epoxy resin 127 maybe white heat-resistant resin which reflects light. In this case, the resin 127 has an effect of serving as a reflection case. When the optical radiation surface is embodied as a top surface of the reflection case, an efficiency of extracting light is greatly improved. At this time, a hole 124 is formed in the upper surface of the case such that the leads 126*a*, 126*b* become exposed. When the transparent epoxy resin 127 has become set, the pair of plate-like leads 126*a*, 126*b* are bent substantially at a right angle along the side surfaces of the transparent epoxy resin 127. The leads 126*a*, 126*b* are further bent at substantially a right angle along the bottom surface. By way of the hole 124 through which the leads 126*a*, 126*b* are exposed, Zener diodes 123*a*, 123*b* are mounted on the respective leads 126*a*, 126*b*. The GaN-based light-emitting elements 122*a*, 122*b* are mounted on the Zener diodes 123*a*, 123*b* with electrodes thereof being oriented facedown. Here, a diode having a reversed polarity is used for one of the Zener diodes 123*a*, 123*b*. The wire 125 is bonded to tops of the Zener diodes 123*a*, 123*b*, thereby interconnecting the light-emitting elements 122*a*, 122*b* in series.

The hole 124 is sealed with the epoxy resin 127, thereby forming an optical radiation plane 128 on the upper surface of the resin. The leads 126*a*, 126*b* may be folded after the Zener diodes 123*a*, 123*b*, the light-emitting elements 122*a*, 122*b* have been mounted and the hole 124 has been sealed with the transparent epoxy resin 127. As shown in FIG. 4B, the leads 126*a*, 126*b* wrap around the bottom surface of the transparent epoxy resin 127. As a result, the LED lamp 131 can be subjected to surface mounting. When power is supplied to the LED lamp 131 by way of the leads 126*a*, 126*b*, an electric current flows into the light-emitting elements 122*a*, 122*b* in series. Light is radiated externally from the optical radiation plane 28 formed from the transparent epoxy resin 127. The optical radiation plane 128 is not limited to a flat plane and may be a convex lens. Since the LED lamp 131 according to the third embodiment has the two light-emitting elements 122*a*, 122*b* by means of reducing an interconnection space, the LED lamp 131 can externally radiate the light that is about twice the light emanated from a related-art LED lamp. Since the two light-emitting elements 122*a*, 122*b* are mounted on the separate leads 126*a*, 126*b*, the light-emitting elements are superior in heatsinking performance. There can be prevented occurrence of a drop in luminous efficiency, which would otherwise be caused when the light-emitting elements 122*a*, 122*b* have become hot.

As mentioned above, the LED lamp 131 according to the third embodiment has brightness which is about twice a related-art LED lamp. The LED lamp 131 is superior in heatsinking performance and can prevent occurrence of a drop in luminous efficiency.

The embodiments have described a case where Zener diodes are used as sub-mounts to be used for mounting light-emitting elements. In other respects, there may also be used a conductive substrate.

Fourth Embodiment

Next, a fourth embodiment of the invention will be described by reference to FIGS. 5 through 7.

Figure 5A:
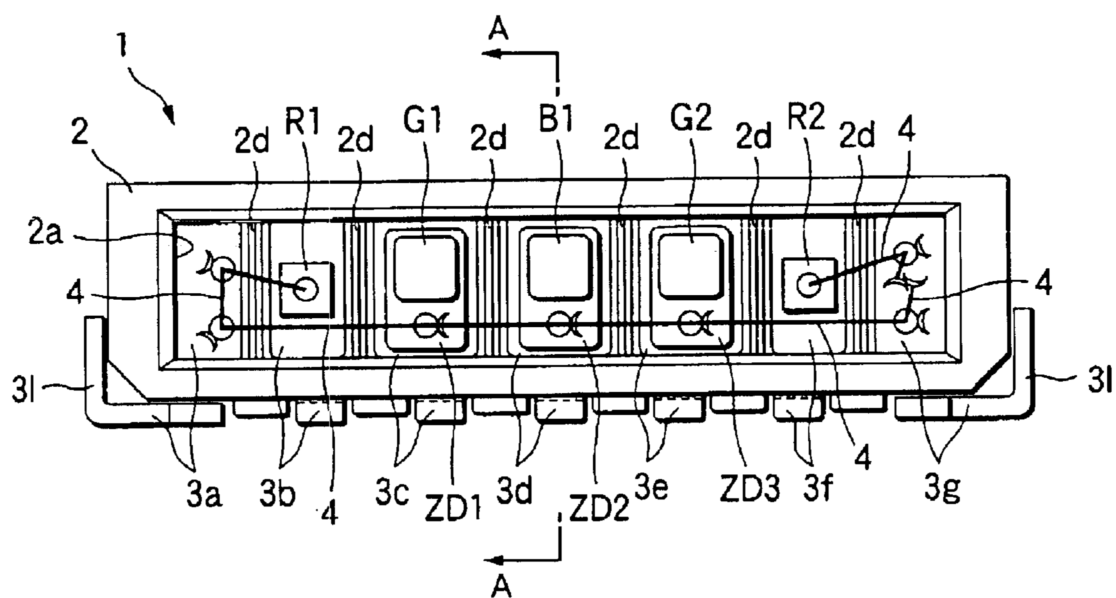
FIG. 5A is a front view showing the overall configuration of an LED lamp according to a fourth embodiment of the invention.
Figure 5B:
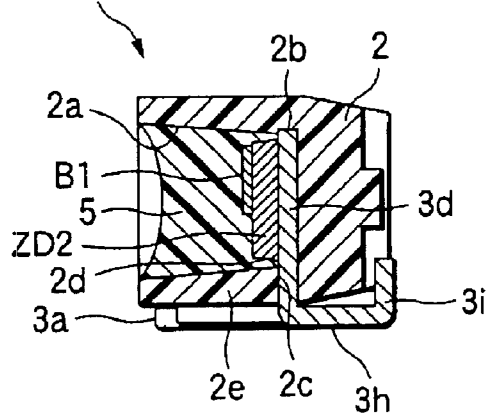
FIG. 5B is a cross-sectional view taken along line A—A shown in FIG. 5A.
Figure 5C:
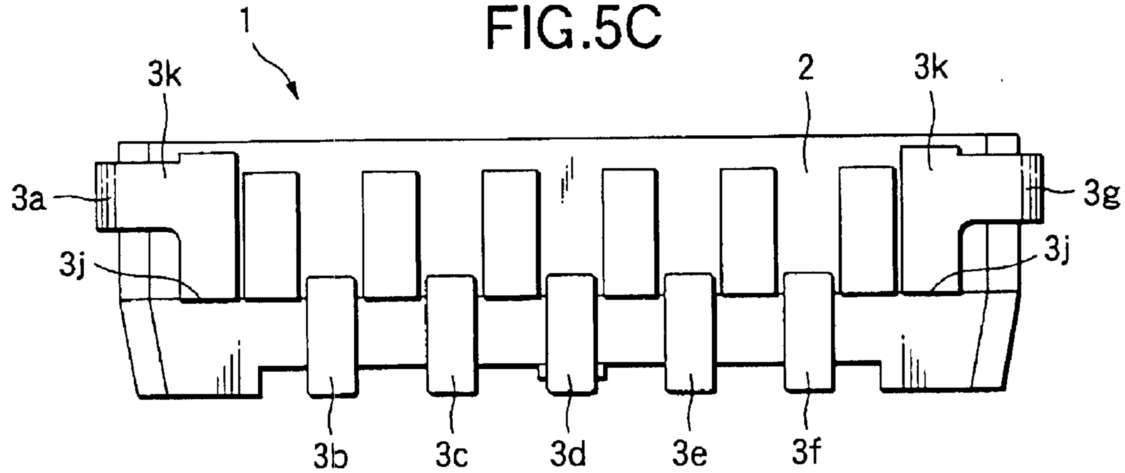
FIG. 5C is a bottom view of the LED lamp.

As shown in FIG. 5A, an LED lamp 1 according to the fourth embodiment has a case (package) 2 formed from liquid-crystal polymer by means of injection molding. Seven leads 3*a*, 3*b*, 3*c*, 3*d*, 3*e*, 3*f*, and 3*g* are arranged in an opening section 2*a* of the case 2. As shown in FIG. 5B, the leads 3*a* through 3*g* are sandwiched between a clearance 2*c* formed in the lower end of the opening section 2*a* of the case 2 and a notch 2*b* formed in the upper end of the opening section 2*a*. The lower ends of the leads 3*b*, 3*c*, 3*d*, 3*e*, and 3*f* (first leads) are bent backward at substantially a right angle at positions where the ends protrude from the case 2 (3*h* in FIG. 5B). The thus-bent lower ends are further bent at substantially a right angle along the back surface of the case 2 (3*i* in FIG. 5B). The lower ends of the leads 3*a*, 3*g* (second leads), which are disposed at respective lateral ends of the case 2 and are each made of a single lead, are bent forward at substantially a right angle at positions where the lower ends protrude from the case 2 (3*j* in FIG. 5C). As shown in FIG. 5C, the lower ends of the leads 3*a*, 3*g* that are bent at substantially a right angle in the longitudinal direction of the case 2 (3*k* in FIG. 5C) are further bent upward at substantially a right angle along the side surfaces of the case 2 (3*l* in FIG. 5A) The case 2 and the leads respectively correspond to the package 107 and the wire 105 of the first invention.

The leads 3*a* through 3*g* and the case 2 are formed into one piece, by means of setting the leads 3*a* through 3*g*, which are flat before being folded, in a die to be used for injection molding the case 2, and subjecting the case 2 to insertion molding.

The load—which is imposed on the case 2 at the time of bending the lower ends of the leads 3*b*, 3*c*, 3*d*, 3*e*, and 3*f* backward—is applied to the notch 2*b* formed in the upper end of the opening section 2*a* as well as to a portion 2*e* of the case which supports portions of the leads held by the clearance 2*c* formed in the lower end of the opening section 2*a*. As a result, even when the portion 2*e* of the case 2 for supporting the leads is made thin, there arises no chance of cracking arising in the portion 2*e*. Thus, the case 2 can sufficiently withstand the stress stemming from bending of the leads. Consequently, the case 2 can be made thinner (or of lower profile) than in the case of the related-art LED lamp.

As shown in FIG. 5A, six projections 2*d* formed integrally with the case 2 are interposed between the leads 3*a* through 3*g*. The projections 2*d* prevent occurrence of a connection between adjacent leads, which would otherwise be caused by flow of silver paste when light-emitting diodes are mounted on the respective leads 3*a* through 3*g*. Light-emitting elements are mounted on the respective leads 3*b*, 3*c*, 3*d*, 3*e*, and 3*f*, which are located in the vicinity of the center. More specifically, a red light-emitting element R1 is mounted on the lead 3*b*. A Zener diode ZD1 is mounted on the lead 3*c*, and a green light-emitting element G1 is in turn mounted on the Zener diode ZD1. A Zener diode ZD2 is mounted on the lead 3*d*, and a blue light-emitting element B2 is in turn mounted on the Zener diode ZD2. A Zener diode ZD3 is mounted on a lead 3*e*, and a green light-emitting element G2 is in turn mounted on the Zener diode ZD3. A red light-emitting element R2 is mounted on the lead 3*f*. Zener diodes which are reversed in polarity from a normal Zener diode are employed as the Zener diodes ZD1, ZD2, and ZD3.

P-sides of the GaAs-based red light-emitting elements R1, R2 are mounted on the leads 3*b*, 3*f*, respectively, with silver paste while p-sides of the elements are taken as upper surfaces; that is, light-emitting planes. As a result of the p-sides of the light-emitting elements R1, R2 having been taken as light-emitting planes, the light-emitting elements R1, R2 are made higher in intensity as compared with a case where n-sides of the red light-emitting elements are taken as light-emitting planes. The Zener diodes ZD1, ZD2, and ZD3 are mounted on the leads 3*c*, 3*d*, and 3*e* with silver paste while their anodes are oriented facedown. The GaN-based green light-emitting elements G1, G2 and the blue light-emitting element B1 are connected to two electrodes provided on top of the Zener diodes ZD1, ZD2, and ZD3 by use of gold bumps while their transparent electrodes are oriented facedown. By means of adoption of such a flip-chip structure, sapphire substrates of the GaN-based light-emitting elements G1, G2, and B1 are taken as upper surfaces; that is, light-emitting planes. The light-emitting elements G1, G2, and B1 are made higher in intensity as compared with a case where transparent electrodes of green light-emitting elements are taken as light-emitting planes. Consequently, the red light-emitting elements R1 and R2, the green light-emitting elements G1 and G2, and the blue light-emitting element B1 are all made higher in intensity. Consequently, the white LED lamp 1, which is a mixture of these colors, can achieve higher intensity.

The anode electrode on the surface of the red light-emitting element R1 and the lead 3*a* are bonded together by use of a wire 4. The lead 3*a* is subjected to additional bonding (safety bonding) for enhancing reliability, thereby bonding together the lead 3*a* and the top of the Zener diode ZD1. By means of the wire 4, the top of the Zener diode ZD1, that of the Zener diode ZD2, that of the Zener diode ZD3, the lead 3*g*, and the anode electrode of the red light-emitting element R2 are bonded together. The lead 3*g* is subjected to additional safety bonding. As shown in FIG. 5B, the opening section 2*a* of the case 2 is filled and sealed with transparent epoxy resin 5 serving as translucent material.

Figure 6:
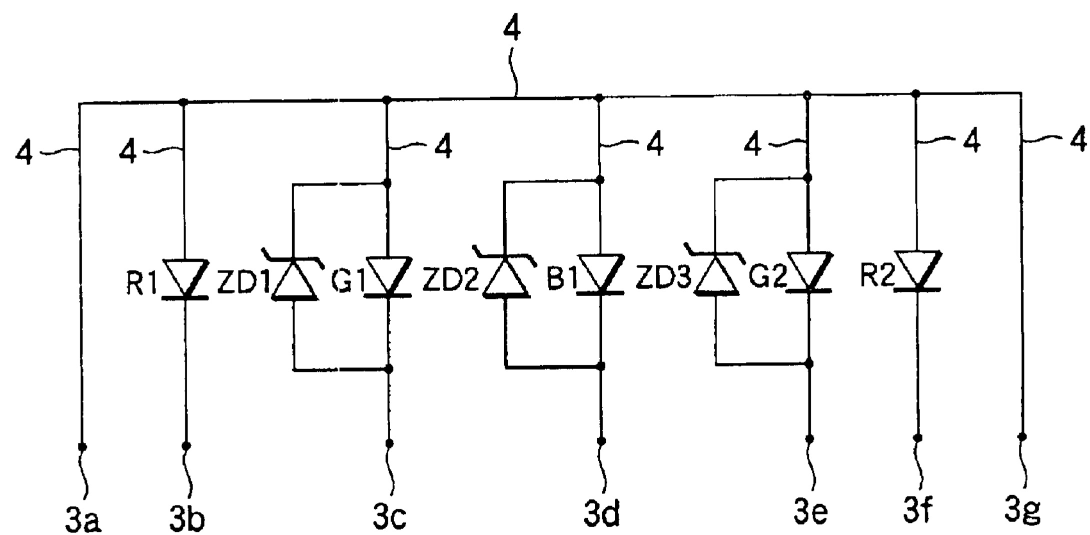
FIG. 6 is a circuit diagram showing the circuit configuration of the LED lamp according to the fourth embodiment of the invention.
Figure 7:
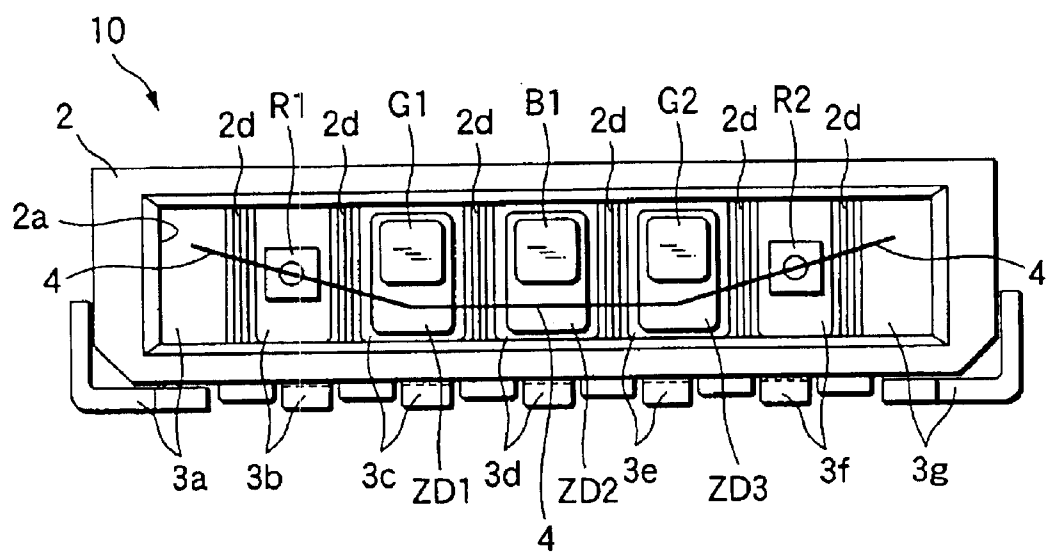
FIG. 7 is a front view showing the overall configuration of an LED lamp according to a modification of the fourth embodiment.

As shown in FIG. 6, the circuit configuration of the LED lamp 1 in which the leads 3*a* through 3*g* are electrically connected together by use of the wire 4 corresponds to an anode common circuit which takes the leads 3*a*, 3*g* as anode terminals. As mentioned above, use of the Zener diodes ZD1, ZD2, and ZD3 having reversed polarities has realized an anode common circuit of flip-chip structure. As a result, the number of terminals can be reduced, thereby miniaturizing the LED lamp 1.

In relation to the LED lamp 1 according to the fourth embodiment, the wire 4 is bonded to the tops of the light-emitting elements and the tops of the Zener diodes. Hence, the LED lamp 1 does not require any large wire space such as that required by a related-art LED 51. As shown in FIG. 5A, the thickness of the opening section 2*a* of the case 2 (i.e., the length of the case 2 in its longitudinal direction) can be made small. As a result, in association with a reduction in the profile of the lower part of the case 2, the overall outside shape of the case 2 can be made further smaller.

In the LED lamp 1, the light-emitting elements R1, G1, B1, G2, and R2 are mounted separately on the respective leads 3*b*, 3*c*, 3*d*, 3*e*, and 3*f*. The LED lamp 1 is superior in heat dissipation to the related-art LED lamp 51. Particularly, the red light-emitting elements R1, R2, whose luminous efficiencies drop sharply at high temperature, are also superior in heat dissipation. Hence, the red light-emitting elements R1, R2 maintain high luminous efficiencies, thereby contributing to enhancement of overall intensity of the LED lamp 1.

As mentioned, the LED lamp 1 according to the fourth embodiment enables slimming down of the opening section 2*a* of the case 2, slimming down of an outside shape of the case, higher intensity, and superior heat-sink performance.

Since the fourth embodiment employs the two green light-emitting elements G1, G2 and one blue light-emitting element B1, the LED lamp 1 radiates white light which is greenish. The green light-emitting element is superior in luminous efficiency to a blue light-emitting element, thus requiring lower power. In a case where bluish white light is required, two blue light-emitting elements B1, B2 and one green light-emitting element G1 are employed. The green light-emitting element G1 is mounted on the Zener diode ZD2 shown in FIG. 5A, and the blue light-emitting elements B1, B2 are mounted on the respective Zener diodes ZD1, ZD3 shown in FIG. 5A.

A modification of the fourth embodiment will now be described by reference to FIG. 7. Those elements which are the same as those employed in the first embodiment are assigned the same reference numerals, and repeated explanations thereof are omitted. As shown in FIG. 7, an LED lamp 10 according to a modification of the fourth embodiment differs from the LED lamp 1 described in connection with the fourth embodiment in the manner of bonding the wire 4. More specifically, in relation to the LED lamp 10, the lead 3*a*, the red light-emitting element R1, the Zener diodes ZD1, ZD2, ZD3, the red light-emitting element R2, and the lead 3*g* are consecutively bonded with the wire 4 rather than, in the case of the LED lamp 1, the wire 4 being subjected to safety bonding at each bonding position. Consequently, the elements R1, ZD1, ZD2, ZD3, R2, and the leads 3*a*, 3*b* are as if connected through use of a single wire 4. Hence, the operation for bonding the wire 4 is simplified, thereby reducing labor requirements.

Fifth Embodiment

A fifth embodiment of the present invention will now be described by reference to FIGS. 8A through 8C. Those elements which are the same as those shown in FIG. 5 described in connection with the fourth embodiment are assigned the same reference numerals, and repetition of their explanations is omitted.

Figure 8A:
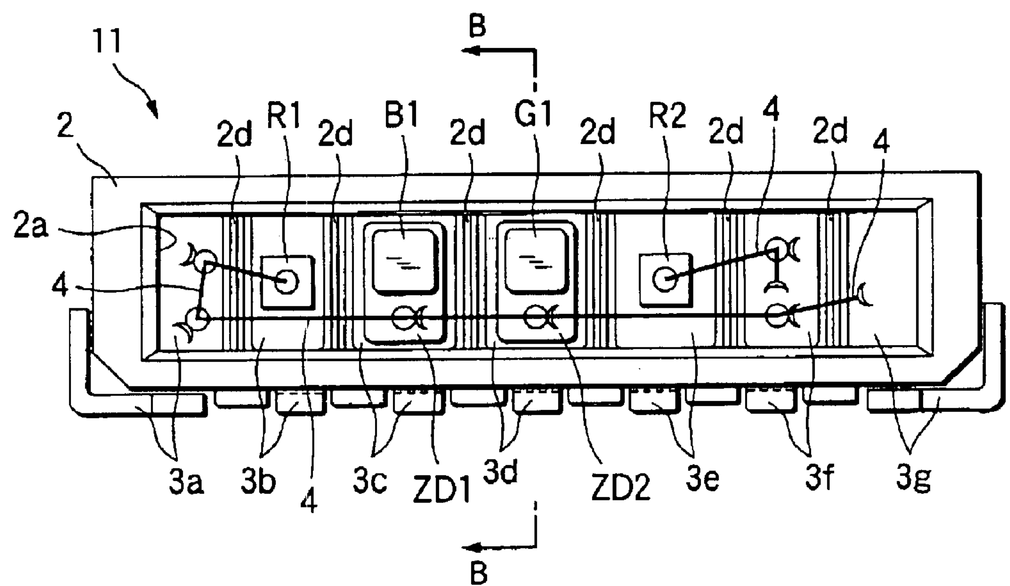
FIG. 8A is a front view showing the overall configuration of an LED lamp according to a fifth embodiment of the invention.
Figure 8B:
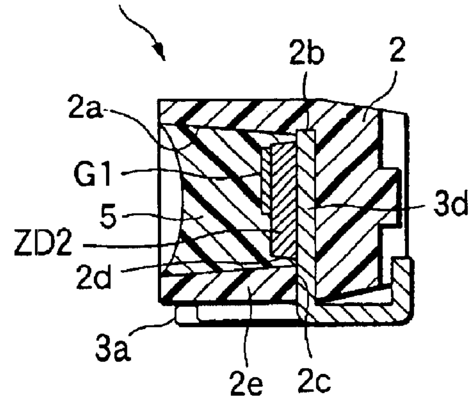
FIG. 8B is a cross-sectional view taken along line B—B shown in FIG. 8A.
Figure 8C:
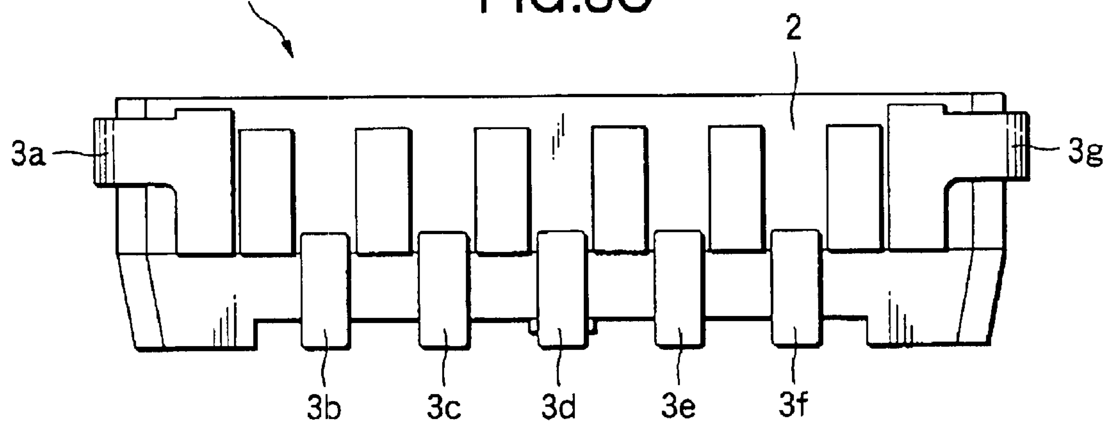
FIG. 8C is a bottom view of the LED lamp.

As shown in FIGS. 8A through 8C, an LED lamp 11 according to the fifth embodiment differs from that described in connection with the fourth embodiment in that only one green light-emitting element is employed. More specifically, the red light-emitting element R1 is mounted on the lead 3*b*, and the blue light-emitting element B1 is mounted on the lead 3*c* via the Zener diode ZD1. Further, the green light-emitting element G1 is mounted on the lead 3*d* via the Zener diode ZD2, and the red light-emitting element R2 is mounted on the lead 3*e*.

Further, no light-emitting element is mounted on the lead 3*f*, and the anode electrode provided on the top of the red light-emitting element R2 is connected to the lead 3*f* with the wire 4 through bonding. Further, the lead 3*f* is subjected to additional safety bonding. Thus, the lead 3*f* acts as an anode-side terminal along with the lead 3*a*. The lead 3*a* is bonded with the wire 4 to the anode electrode provided on top of the red light-emitting element R1. The lead 3*a* is subjected to additional safety bonding. The lead 3*a* and the top of the Zener diode ZD1 are bonded together with the wire 4. Further, the top of the Zener diode ZD1 and the top of the Zener diode ZD2 are connected together with the wire 4. Moreover, the top of the Zener diode ZD2 and the lead 3*f* are bonded together with the wire 4, and the leads 3*f* and 3*g* are bonded together with the wire 4. In this way, an anode common circuit is configured in the LED 11. As shown in FIG. 8B, the opening section 2*a* of the case 2 is filled and sealed with the transparent epoxy resin 5 serving as translucent material.

As compared with the LED lamp 1, the LED lamp 11 according to the fifth embodiment having the foregoing configuration has one fewer light-emitting element and one fewer Zener diode. Hence, the LED lamp 11 is simple in structure, and the time required for manufacturing the LED lamp 11 is shortened. Further, production costs can be diminished. In other respects, the LED lamp 11 is analogous to the LED lamp 1. Hence, even the LED lamp 11 according to the fifth embodiment enables slimming down of the opening section 2*a* of the case 2, slimming down of an outside shape of the case, higher intensity, and superior heatsink performance.

Sixth Embodiment

A sixth embodiment of the present invention will now be described by reference to FIGS. 9A through 9C. Those elements which are the same as those shown in FIG. 5 described in connection with the fourth embodiment are assigned the same reference numerals, and repetition of their explanations is omitted.

Figure 9A:
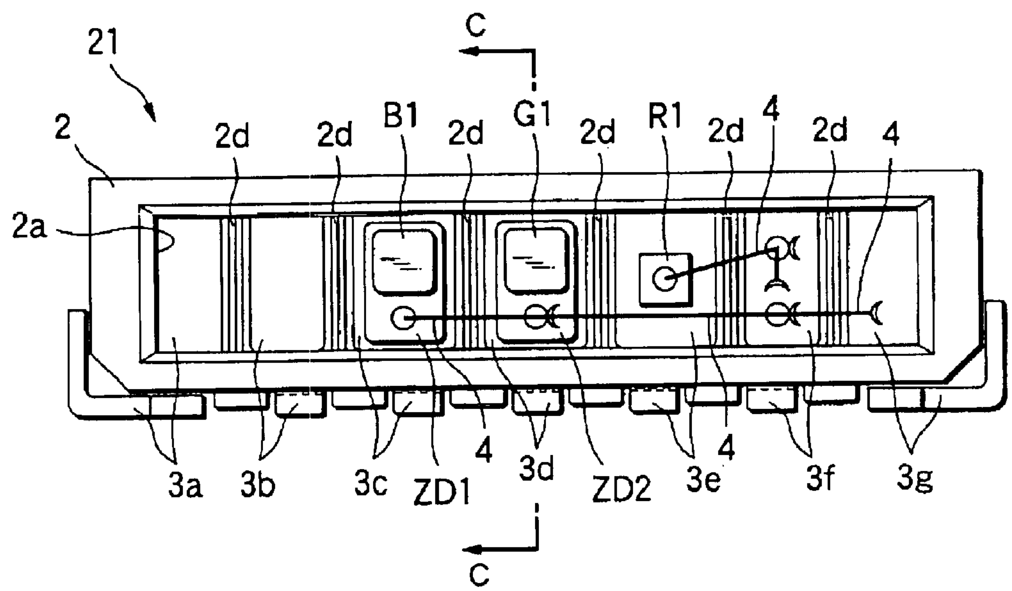
FIG. 9A is a front view showing the overall configuration of an LED lamp according to a sixth embodiment of the invention.
Figure 9B:
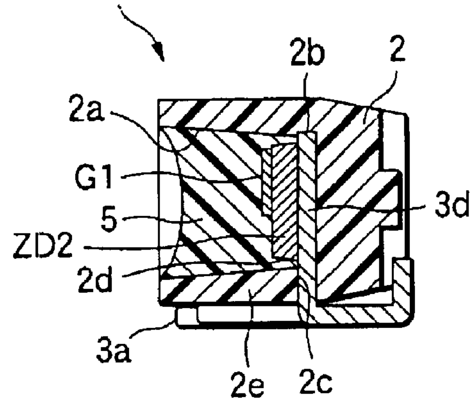
FIG. 9B is a cross-sectional view taken along line C—C shown in FIG. 9A.
Figure 9C:
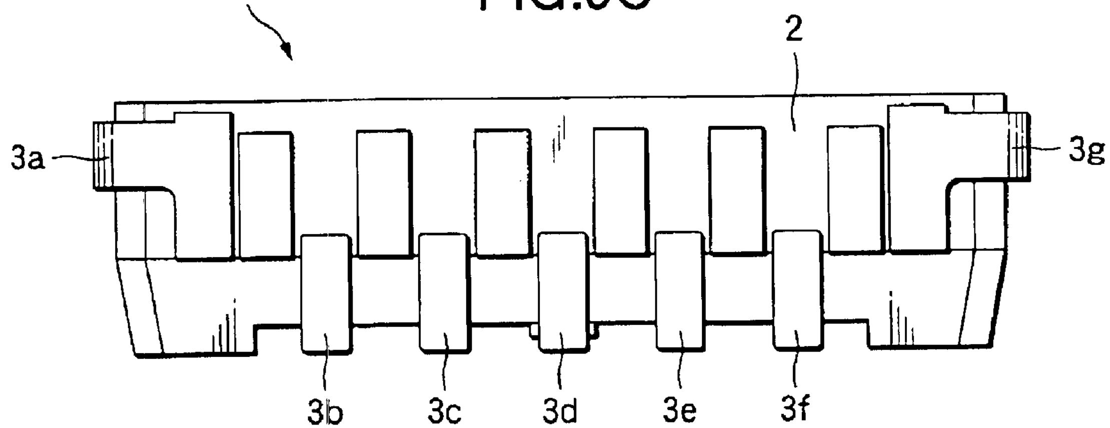
FIG. 9C is a bottom view of the LED lamp.

As shown in FIGS. 9A through 9C, an LED lamp 21 according to the sixth embodiment differs from that described in connection with the fourth embodiment in that only one red light-emitting element, one green light-emitting element, and one blue light-emitting element are employed. More specifically, the blue light-emitting element B1 is mounted on the lead 3*c* by way of the Zener diode ZD1, and the green light-emitting element G1 is mounted on the lead 3*d* via the Zener diode ZD2. Further, the red light-emitting element R1 is mounted on the lead 3*e*.

Further, no light-emitting elements are mounted on the leads 3*a*, 3*b*, 3*f*, and 3*g*. The anode electrode provided on the top of the red light-emitting element R1 is connected to the lead 3*f* with the wire 4 through bonding. Further, the lead 3*f* is subjected to additional safety bonding. Thus, the lead 3*f* acts as an anode-side terminal. Further, the top of the Zener diode ZD1 and the top of the Zener diode ZD2 are bonded together with the wire 4. Moreover, the top of the Zener diode ZD2 and the lead 3*f* are bonded together with the wire 4. The leads 3*f* and 3*g* are bonded together with the wire 4. In this way, an anode common circuit is configured in the LED 21. As shown in FIG. 9B, the opening section 2*a* of the case 2 is filled and sealed with the transparent epoxy resin 5 serving as translucent material.

As compared with the LED lamp 1, the LED lamp 21 according to the sixth embodiment having the foregoing configuration has two fewer light-emitting elements and one fewer Zener diode. Hence, the LED lamp 21 is more simple in structure, and the time required for manufacturing the LED lamp 21 is further shortened. Further, production costs can be curtailed to a much greater extent. In other respects, the LED lamp 21 is analogous to the LED lamp 1. Hence, even the LED lamp 21 according to the sixth embodiment enables slimming down of the opening section 2*a* of the case 2, slimming down of an outside shape of the case, higher intensity, and superior heatsink performance.

As can be seen from the LED lamps 1, 10, 11, and 21 described in connection with the fourth through sixth embodiments, the layout of the elements to be mounted on the seven leads 3*a* through 3*g* fastened to the case 2 can be embodied in a variety of configurations. Consequently, the degree of design freedom becomes great in accordance with an object. For instance, in the sixth embodiment, the Zener diode ZD1 and the blue light-emitting element B1 are mounted on the lead 3*b*, and the red light-emitting element R1 is mounted on the lead 3*f*. As a result, the three light-emitting elements can be spaced apart from each other.

Seventh Embodiment

A seventh embodiment of the present invention will now be described by reference to FIGS. 10A through 10C.

Figure 10A:
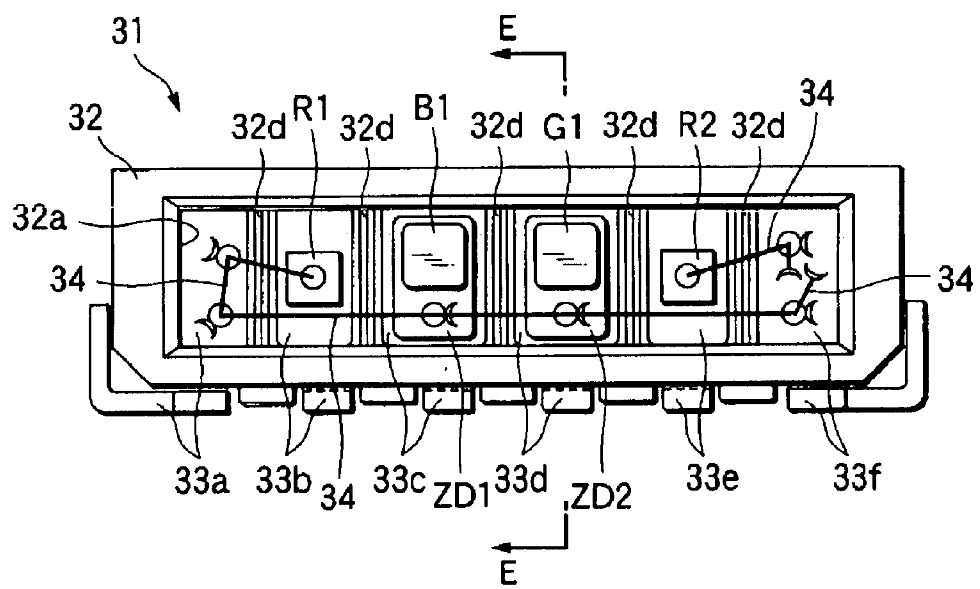
FIG. 10A is a front view showing the overall configuration of an LED lamp according to a seventh embodiment of the invention.
Figure 10B:
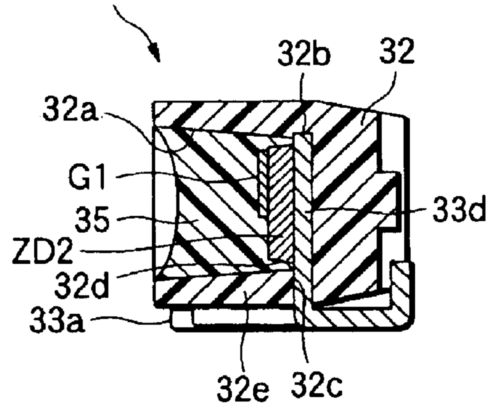
FIG. 10B is a cross-sectional view taken along line E—E shown in FIG. 10A.
Figure 10C:
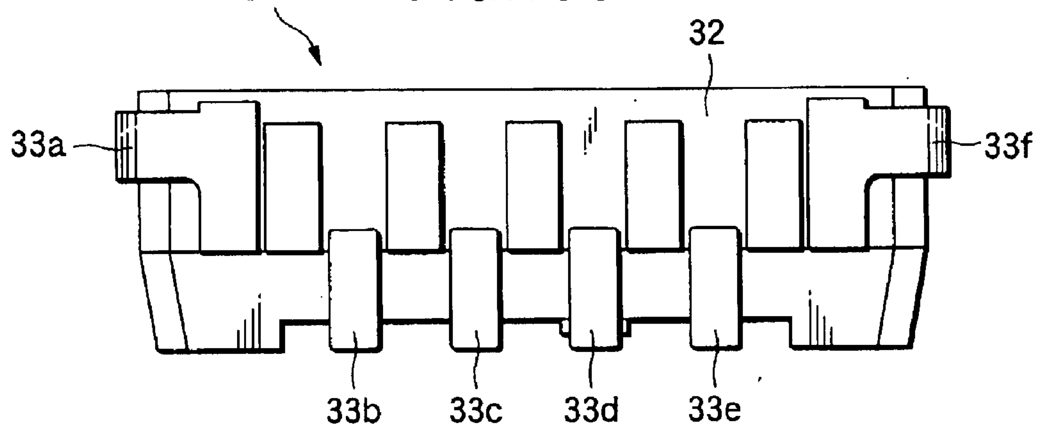
FIG. 10C is a bottom view of the LED lamp.

As shown in FIG. 10A, an LED lamp 31 according to the seventh embodiment has a case (package) 32 formed from liquid-crystal polymer by means of injection molding. Six leads 33*a*, 33*b*, 33*c*, 33*d*, 33*e*, and 33*f* are arranged in an opening section 32*a* of the case 32. As shown in FIG. 10B, the leads 33*a* through 33*f* are sandwiched between a clearance 32*c* formed in the lower end of the opening section 32*a* of the case 32 and a notch 32*b* formed in the upper end of the opening section 32*a*. The lower ends of the leads 33*b*, 33*c*, 33*d*, and 33*e* are bent backward at substantially a right angle at positions where the ends protrude from the case 32. The thus-bent lower ends are further bent at substantially a right angle along the back surface of the case 32. The lower ends of the leads 33*a*, 33*f*, which are disposed at respective lateral ends of the case 32 and are each made of a single lead, are bent forward at substantially a right angle at positions where the lower ends protrude from the case 32. As shown in FIG. 10C, the lower ends of the leads 33*a*, 33*f* that are bent at substantially a right angle in the longitudinal direction of the case 32 and are further bent upward at substantially a right angle along the side surfaces of the case 32.

The leads 33*a* through 33*f* and the case 32 are formed into one piece, by means of setting the leads 33*a* through 33*f*, which are flat before being folded, in a die to be used for injection molding the case 32, and subjecting the case 32 to insertion molding.

The load—which is imposed on the case 32 at the time of bending the lower ends of the leads 33*b*, 33*c*, 33*d*, and 33*e* backward-is applied to the notch 32*b* formed in the upper end of the opening section 32*a*, as well as to a portion 32*e* of the case 32 supporting portions of the leads held by the clearance 32*c* formed in the lower end of the opening section 32*a*. As a result, even when the portion 32*e* supporting the leads of the case 32 is made thin, there arises no chance of cracking arising in the portion 32*e*. Thus, the case 32 can sufficiently withstand the stress stemming from bending of the leads. Consequently, the case 32 can be made thinner (or of lower profile) than a case of the related-art LED lamp.

As shown in FIG. 10A, five projections 32*d* formed integrally with the case 32 are interposed between the leads 33*a* through 33*f*. The projections 32*d* prevent occurrence of a connection between adjacent leads, which would otherwise be caused by flow of silver paste when light-emitting diodes are mounted on the respective leads 33*a* through 33*f*. Light-emitting elements are mounted on the respective leads 33*b*, 33*c*, 33*d*, and 33*e*, which are located in the vicinity of the center. More specifically, the red light-emitting element R1 is mounted on the lead 33*b*. The Zener diode ZD1 is mounted on the lead 33*c*, and the blue light-emitting element B1 is in turn mounted on the Zener diode ZD1. The Zener diode ZD2 is mounted on the lead 33*d*, and the green light-emitting element G1 is in turn mounted on the Zener diode ZD2. The red light-emitting element R2 is mounted on the lead 33*e*. Zener diodes which are reversed in polarity from a normal Zener diode are employed as the Zener diodes ZD1 and ZD2.

P-sides of the GaAs-based red light-emitting elements R1, R2 are mounted respectively on the leads 33*b*, 33*e* with silver paste while p-sides of the elements are taken as upper surfaces; that is, light-emitting planes. As a result of the p-sides of the light-emitting elements R1, R2 having been taken as light-emitting planes, the light-emitting elements R1, R2 are made higher in intensity than in a case where n-sides of the red light-emitting elements are taken as light-emitting planes. The Zener diodes ZD1 and ZD2 are mounted on the leads 33*c*, 33*d* with silver paste while their anodes are oriented facedown. The GaN-based blue light-emitting element B1 and the green light-emitting element G1 are connected to two electrodes provided on top of the Zener diodes ZD1, ZD2 with use of gold bumps while their electrodes are oriented facedown. By means of adoption of such a flip-chip structure, sapphire substrates of the GaN-based light-emitting elements G1, B1 are taken as upper surfaces; that is, light-emitting planes. The light-emitting elements G1, B1 are made higher in intensity than in a case where transparent electrodes of light-emitting elements are taken as light-emitting planes. Consequently, the red light-emitting elements R1, R2, the green light-emitting element G1, and the blue light-emitting element B1 are all made higher in intensity. Consequently, the white LED lamp 31, which is a mixture of these colors, can achieve higher intensity.

The anode electrode on the surface of the red light-emitting element R1 and the lead 33*a* are bonded together by use of a wire 34. The lead 33*a* is subjected to additional bonding (safety bonding) for enhancing reliability, and the lead 33*a* and the top of the Zener diode ZD1 are bonded together. By means of the wire 34, the top of the Zener diode ZD1, that of the Zener diode ZD2, the lead 33*f*, and the anode electrode of the red light-emitting element R2 are bonded together. The lead 33*f* is subjected to additional safety bonding. As shown in FIG. 10B, the opening section 32*a* of the case 32 is filled and sealed with transparent epoxy resin 35 serving as translucent material.

In relation to the LED lamp 31 according to the seventh embodiment, the wire 34 is bonded to the tops of the light-emitting elements and the tops of the Zener diodes. Hence, the LED lamp 31 does not require any large wire space such as that required by the related-art LED 51. As shown in FIG. 10A, the thickness of the opening section 32*a* of the case 32 (i.e., the length of the case 2 in its longitudinal direction) can be made small. As a result, in association with a reduction in the profile of the lower part of the case 32, the overall outside shape of the case 32 can be made further smaller.

In the LED lamp 31, the light-emitting elements R1, B1, G1, and R2 are mounted separately on the respective leads 3*b*, 3*c*, 3*d*, and 3*e*. The LED lamp 31 is superior in heat dissipation to the related-art LED lamp 51. Particularly, the red light-emitting elements R1, R2 whose luminous efficiencies drop sharply at high temperatures are also superior in heat dissipation. Hence, the red light-emitting elements R1, R2 maintain high luminous efficiencies, thereby contributing to enhancement of overall intensity of the LED lamp 31.

As mentioned, the LED lamp 31 according to the seventh embodiment enables slimming down of the opening section 32*a* of the case 32, slimming down of an outside shape of the case, higher intensity, and superior heatsink performance.

Eighth Embodiment

An eighth embodiment of the present invention will now be described by reference to FIGS. 11A through 11C.

Figure 11A:
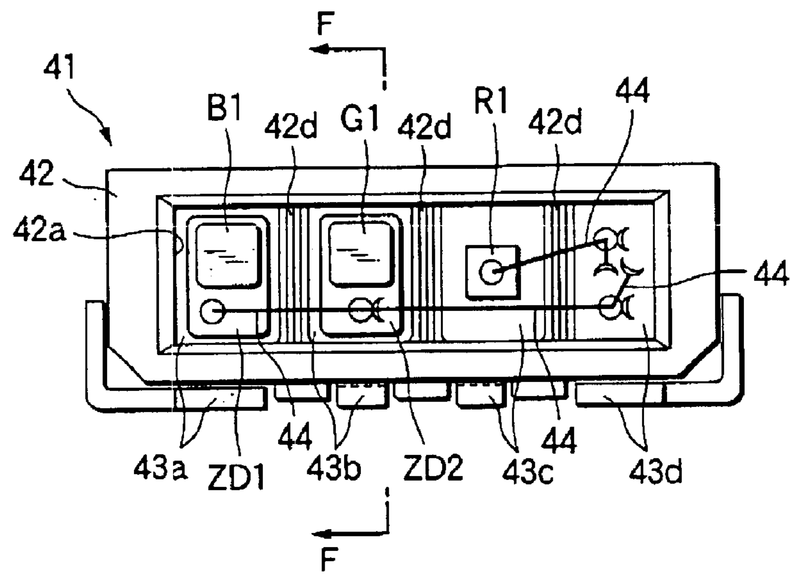
FIG. 11A is a front view showing the overall configuration of an LED lamp according to an eighth embodiment of the invention.
Figure 11B:
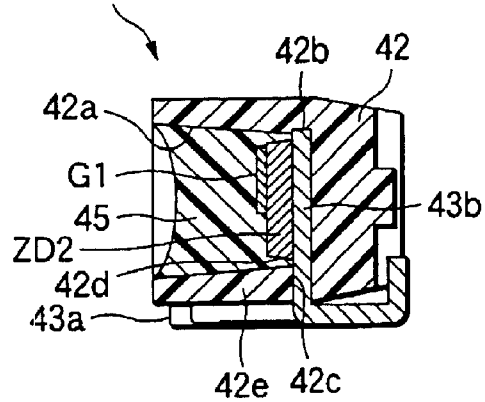
FIG. 11B is a cross-sectional view taken along line F—F shown in FIG. 11A.
Figure 11C:
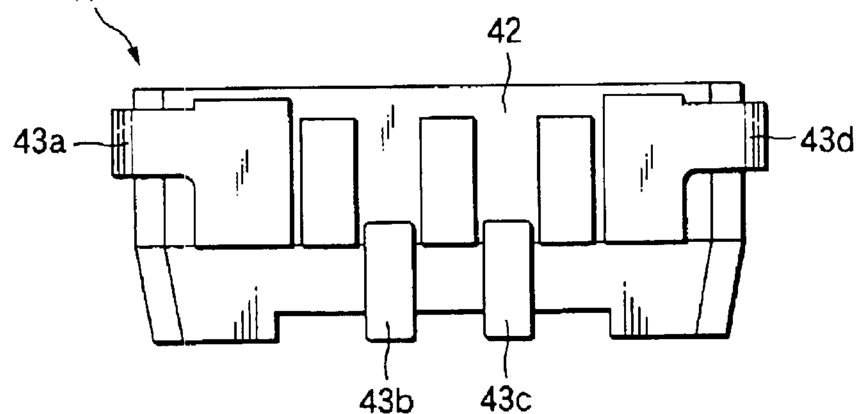
FIG. 11C is a bottom view of the LED lamp.
Figure 12A:
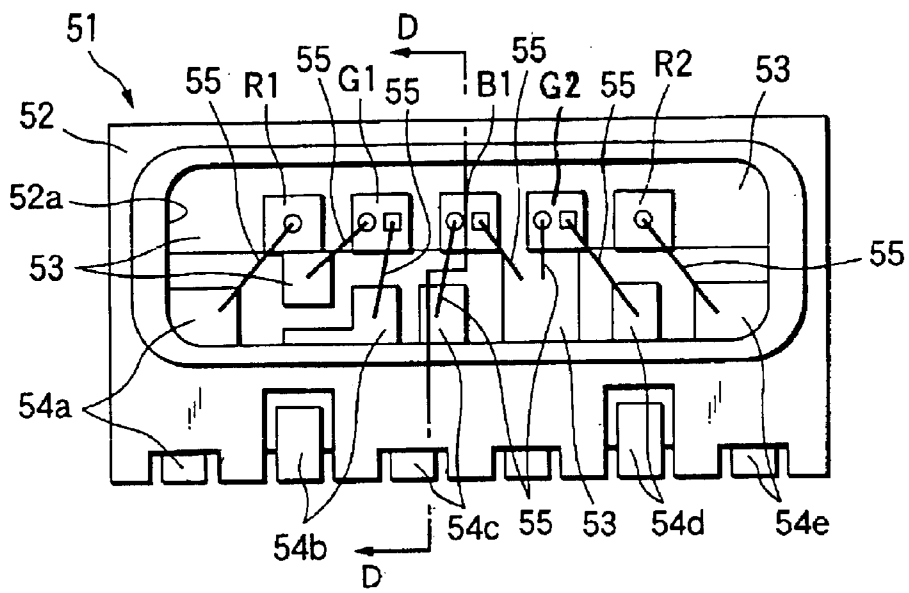
FIG. 12A is a front view showing the construction of a related-art LED lamp.
Figure 12B:
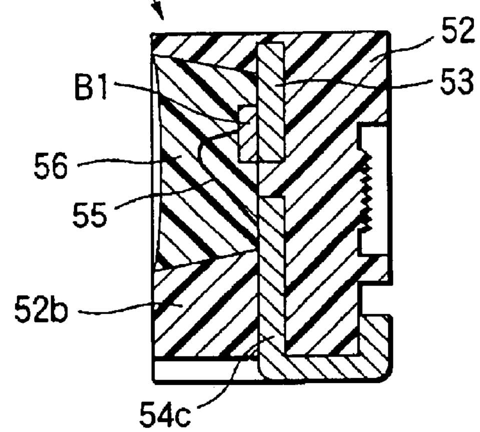
FIG. 12B is a cross-sectional view of the LED lamp taken along line D—D in FIG. 12A.
Figure 13:
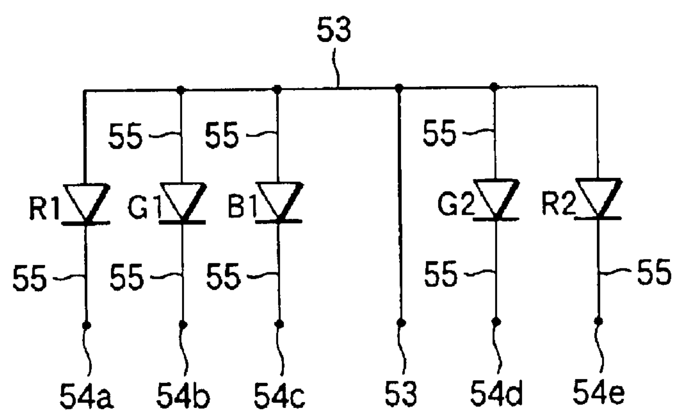
FIG. 13 is a circuit diagram showing the circuit configuration of the related-art LED lamp.

As shown in FIG. 11A, an LED lamp 41 according to the eighth embodiment has a case (package) 42 formed from liquid-crystal polymer by means of injection molding. Four leads 43*a*, 43*b*, 43*c*, and 43*d* are arranged in an opening section 42*a* of the case 42. As shown in FIG. 11B, the leads 43*a* through 43*d* are sandwiched between a clearance 42*c* formed in the lower end of the opening section 42*a* of the case 42 and a notch 42*b* formed in the upper end of the opening section 42*a*. The lower ends of the leads 43*b*, 43*c*, which are other than leads disposed at the respective lateral ends of the LED lamp 41, are bent backward at substantially a right angle at positions where the ends protrude from the case 42. The thus-bent lower ends are further bent at substantially a right angle along the back surface of the case 42. The lower ends of the leads 43*a*, 43*d* are bent forward at substantially a right angle at positions where the lower ends protrude from the case 42. As shown in FIG. 11C, the lower ends of the leads 43*a*, 43*d* that are bent at substantially a right angle in the longitudinal direction of the case 42 are further bent upward at substantially a right angle along the side surfaces of the case 42.

The leads 43*a* through 43*d* and the case 42 are formed into one piece, by means of setting the leads 43*a* through 43*d*, which are flat before being folded, in a die to be used for injection molding the case 42, and subjecting the case 42 to insertion molding.

The load—which is imposed on the case 42 at the time of bending the lower ends of the leads 43*b* and 43*c* backward—is applied to the notch 42*b* formed in the upper end of the opening section 42*a*, as well as to the portion 42*e* of the case supporting portions of the leads held by the clearance 42*c* formed in the lower end of the opening section 42*a*. As a result, even when the portion 42*e* supporting the leads of the case 42 is made thin, there arises no chance of cracking arising in the portion 42*e*. Consequently, the case 42 can sufficiently withstand the stress stemming from bending of the leads. Consequently, the case 42 can be made thinner (or of lower profile) than a case of the related-art LED lamp.

As shown in FIG. 11A, three projections 42*d* formed integrally with the case 42 are interposed between the leads 43*a* through 43*d*. The projections 42*d* prevent occurrence of a connection between adjacent leads, which would otherwise be caused by flow of silver paste when light-emitting diodes are mounted on the respective leads 43*a* through 43*d*. Light-emitting elements are mounted on the respective leads 43*a*, 43*b*, and 43*c*. More specifically, the Zener diode ZD1 is mounted on the lead 43*a*, and the blue light-emitting element B1 is in turn mounted on the Zener diode ZD1. The Zener diode ZD2 is mounted on the lead 43*b*, and the green light-emitting element G1 is in turn mounted on the Zener diode ZD2. The red light-emitting element R1 is mounted on the lead 43*c*. Zener diodes which are reversed in polarity from a normal Zener diode are employed as the Zener diodes ZD1 and ZD2.

A P-side of the GaAs-based red light-emitting elements R1 is mounted on the lead 43*c* with silver paste while the p-side is taken as an upper surface; that is, a light-emitting plane. As a result of the p-side of the light-emitting element R1 having been taken as alight-emitting plane, the light-emitting element R1 is made higher in intensity than in a case where an n-side of the red light-emitting element is taken as a light-emitting plane. The Zener diodes ZD1 and ZD2 are mounted on the leads 43*a*, 43*b* with silver paste while their anodes are oriented facedown. The GaN-based blue light-emitting element B1 and the green light-emitting element G1 are connected to two electrodes provided on top of the Zener diodes ZD1, ZD2 by use of gold bumps while their electrodes are oriented facedown. By means of adoption of such a flip-chip structure, sapphire substrates of the GaN-based light-emitting elements B1, G1 are taken as upper surfaces; that is, light-emitting planes. The light-emitting elements B1, G1 are made higher in intensity than in a case where transparent electrodes of light-emitting elements are taken as light-emitting planes. Consequently, the red light-emitting element R1, the green light-emitting element G1, and the blue light-emitting element B1 are all made higher in intensity. Consequently, the white LED lamp 41, which is a mixture of these colors, can achieve higher intensity.

The top of the Zener diode ZD1 and the top of the Zener diode ZD2 are bonded together by means of a wire 44.

Further, the top of the Zener diode ZD2 and the lead 43*d* serving as a single lead are bonded together by means of the wire 44. Moreover, an anode electrode provided on the surface of the red light-emitting element R1 and the lead 43*d* are bonded together by means of the wire 44. The lead 43*d* is subjected to additional safety bonding. As shown in FIG. 11B, the opening section 42*a* of the case 42 is filled and sealed with transparent epoxy resin 45 serving as translucent material.

In relation to the LED lamp 41 according to the eighth embodiment, the wire 44 is bonded to the tops of the light-emitting element sand the tops of the Zener diodes. Hence, the LED lamp 41 does not require any large wire space such as that required by the related-art LED 51. As shown in FIG. 11A, the thickness of the opening section 42*a* of the case 42 (i.e., the length of the case 2 in its longitudinal direction) can be made small. As a result, in association with a reduction in the profile of the lower part of the case 42, the overall outside shape of the case 42 can be made further smaller.

In the LED lamp 41, the light-emitting elements B1, G1, and R1 are mounted separately on the respective leads 43*a*, 43*b*, and 43*c*. The LED lamp 41 is superior in heat dissipation to the related-art LED lamp 51. Particularly, the red light-emitting element R1 whose luminous efficiency drops sharply at high temperature is also superior in heat dissipation. Hence, the red light-emitting element R1 maintains high luminous efficiency, thereby contributing to enhancement of the overall intensity of the LED lamp 41.

As mentioned previously, the LED lamp 41 according to the eighth embodiment enables slimming down of the opening section 42*a* of the case 42, slimming down of an outside shape of the case, higher intensity, and superior heatsink performance.

As has been described, the opening sections 2*a*, 32*a*, and 43*a* of the cases 2, 32, and 42 in the LED lamps 1, 10, 11, 21, 31, and 41 described in connection with the fourth through eighth embodiments are made slim, and the outside shapes of the LED lamps are made thinner. Such a reduction in the thickness of the opening section and that in the outside shape of the LED lamp enable an improvement in an efficiency of light entering a light-guide plate such as a transparent acrylic plate when the LED lamp is used as a backlight and contribute to an increase in intensity of the backlight.

The embodiments have described examples in which light-emitting elements of the primary colors; that is, a red light-emitting element, a green light-emitting element, and a blue light-emitting element, are used for constituting a white LED lamp. However, light-emitting elements of other colors may be employed, or light-emitting elements of four or more colors may be employed. Alternatively, a plurality of light-emitting elements of two colors or monochrome light-emitting elements may be used.

The embodiments have described an example in which liquid-crystal polymer—which is one type of synthetic resin—is used as material of a case. However, various materials, including synthetic resin of another type, can also be employed. Further, a method of forming a case is not limited to the injection molding method, and various molding methods may also be employed.

The embodiments have described an example in which transparent epoxy resin is used as sealing and translucent material. However, any type of translucent material may be employed, including transparent silicon resin, so long as the material satisfies certain requirements; that is, fluidity before setting, a filling property, transparency after setting, and strength.

Further, the remaining parts of the LED lamp are not limited to the embodiments set forth in terms of the configuration, shape, quantity, size, and connection relationship.

Still further, each of the aforementioned embodiments direct to different features, but these features can be combined or separated to possible extent.

This invention should not be limited to the mode of carrying out this invention and the embodiments described above. Various modifications can be included in this invention within a range which can be easily realized by those skilled in the art without departing from the spirit of the scope of claim.

What is claimed is:

1. An LED (light emitting diode) lamp, comprising:

a plurality of light-emitting elements, each said light-emitting element having two electrodes;

sub-mounts for mounting and for interconnecting said light-emitting elements, each said sub-mount directly contacting one of the two electrodes of a light-emitting element, said sub-mount thereby serving as an electrical interface for said directly-connected electrode; and at least one conductive member, wherein said light-emitting elements are electrically connected by using the electrode not directly connected to a sub-mount and by using the sub-mounts, such that one of said at least one conductive member interconnects two light-emitting elements using the electrodes of said two light-emitting elements that are not directly connected to its sub-mount.

2. The LED lamp according to claim 1, wherein each one of said plurality of light-emitting elements is mounted on a respective one of said sub-mounts.

3. The LED lamp according to claim 1, wherein said plurality of light-emitting elements, said sub-mounts, and said conductive members are sealed in a package with translucent material.

4. The LED lamp according to claim 1, wherein said sub-mounts inter-connected together by said conductive members are reversed in polarity relative to each other.

5. The LED lamp according to claim 4, wherein said sub-mounts comprise Zener diodes.

6. The LED lamp according to claim 1, wherein said sub-mounts are mounted to conductive substrates, thereby electrically interconnecting said sub-mounts and the electrodes directly connected to said sub-mounts.

7. The LED lamp according to claim 1, wherein said plurality of light-emitting elements, said sub-mounts, and said conductive members are sealed in a package with translucent material, wherein additional ones of said conductive members are used as a plurality of first leads to be used for mounting the light-emitting elements, and upper ends of said first leads are caught and held by an upper end of said package, and lower ends of said first leads are caught and held by a lower end of said package so as to project beyond a lower surface of said package, said LED lamp further comprising:

a second lead provided on at least one side of said first leads, wherein an upper end of said second lead is caught and held by the upper end of said package, and a lower end of said second lead is caught and bent by the lower end of said package so as to project beyond the lower surface of said package.

8. The LED lamp according to claim 7, wherein the lower ends of said first leads project beyond the lower surface of said package and are further bent and extend along a back surface of said package, and wherein the lower end of said second lead projecting beyond the lower surface of said package is bent so as to extend laterally, and the lower end of said second lead further protrudes along both side surfaces of the case.

9. The LED lamp according to claim 7, wherein said light-emitting elements comprise at least one red light-emitting element, one green light-emitting element, and one blue light-emitting element.

10. The LED lamp according to claim 7, wherein said light-emitting elements comprise two red light-emitting elements, two green light-emitting elements, and one blue light-emitting element.

11. The LED lamp according to claim 7, wherein said light-emitting elements comprise two red light-emitting elements, one green light-emitting element, and two blue light-emitting elements.

12. The LED lamp according to claim 9, wherein at least one red light-emitting element is mounted to said first lead while an anode or cathode side of said red light-emitting element is taken as an upper surface, and said green and blue light-emitting elements are connected to two electrodes provided on respective tops of Zener diodes mounted on said first leads, through gold bumps while electrode sides of said green and blue light-emitting elements are oriented face-down.

13. The LED lamp according to claim 12, wherein said red light-emitting element is mounted on said first lead while an anode side thereof is taken as an upper surface.

14. The LED lamp according to claim 10, wherein at least one red light-emitting element is mounted to said first lead while an anode or cathode side of said red light-emitting element is taken as an upper surface, and said green and blue light-emitting elements are connected to two electrodes provided on respective tops of Zener diodes mounted on said first leads, through gold bumps while electrode sides of said green and blue tight-emitting elements are oriented face-down.

15. The LED lamp according to claim 14, wherein said red light-emitting element is mounted on said first lead while an anode side thereof is taken as an upper surface.

16. The LED lamp according to claim 11, wherein at least one red light-emitting element is mounted to said first lead while an anode or cathode side of said red light-emitting element is taken as an upper surface, and said green and blue light-emitting elements are connected to two electrodes provided on respective tops of Zener diodes mounted on said first leads, through gold bumps while electrode sides of said green and blue light-emitting elements are oriented face-down.

17. The LED lamp according to claim 16, wherein said red light-emitting element is mounted on said first lead while an anode side thereof is taken as an upper surface.

18. An LED lamp, comprising:

two leads each having a seat at an end thereof, said two seats corresponding to sub-segments into which a concave reflection mirror is split;

diodes being respectively mounted on bottom surfaces of the respective seats and being reversed in polarity to each other;

light-emitting elements being respectively mounted on said respective diodes;

a conductive member interconnecting upper surfaces of said diodes; and a translucent material sealing upper portions of said two leads, said diodes, said light-emitting elements, and said conductive members, and a convex lens being molded in an upper part of said translucent material.

19. An LED lamp, comprising:

a pair of plate-like leads;

diodes being respectively mounted on said plate-like leads and reversed in polarity to each other;

light-emitting elements being mounted on said respective diodes;

a conductive member for interconnecting upper surfaces of said diodes; and sealing material which seals ends of said pair of plate-like leads, said diodes, said light-emitting elements, and said conductive member, wherein said pair of plate-like leads are bent at substantially a right angle along side surfaces and a bottom surface of said sealing material.

20. The LED lamp according to claim 18, wherein said diodes comprise Zener diodes.

21. The LED lamp according to claim 19, wherein said diodes comprise Zener diodes.

22. The LED lamp according to claim 6, wherein at least one said conductive substrate serially-interconnects two of said light-emitting elements.

23. A light-emitting-diode (LED) lamp, comprising:

a plurality of serially-interconnected light-emitting elements; and a plurality of sub-mounts, each said sub-mount providing for mounting one of said light-emitting elements.

24. The LED lamp of claim 23, wherein said sub-mounts comprise Zener diodes.

25. The LED lamp of claim 23, further comprising:

a plurality of conductive substrates, each said conductive substrate mounting at least one of said sub-mounts.

26. The LED lamp of claim 25, wherein at least one said conductive substrate electrically interconnects two of said light-emitting elements.

27. A light-emitting-diode (LED) lamp, comprising:

a plurality of serially-interconnected light-emitting elements; and a plurality of conductive members, each said conductive member electrically interconnecting predetermined pairs of said light-emitting elements.

28. A light-emitting-diode (LED) lamp, comprising:

a plurality of serially-interconnected light-emitting elements, wherein said plurality of serially-interconnected light-emitting elements comprises light-emitting elements of more than one color.

29. A light-emitting-diode (LED) lamp, comprising:

a plurality of serially-interconnected light-emitting-diode elements; and a plurality of heat sinks for said plurality of light-emitting-diode elements, wherein at least one light-emitting-diode element is mounted individually on its own heat sink.

30. An LED lamp, comprising:

two leads each having a seat at an end thereof, said two seats corresponding to sub-segments into which a concave reflection mirror is split, said two leads providing an external electrical connection for said LED lamp; and at least one light-emitting element mounted on each of said seats.

31. A method of interconnecting a plurality of light emitting elements (LEDs) in an LED (light emitting diode) lamp, said method comprising:

for a plurality of light-emitting elements, each said light-emitting element having two electrodes, directly bonding one electrode of said light-emitting element to a metal sub-mount, said directly bonding providing an electrical connection between said electrode of said light-emitting element and said sub-mount, and said metal sub-mount providing a mounting mechanism for a light-emitting element directly bonded thereto;

mounting at least two said sub-mounts having a light-emitting element directly bonded thereto in a structure to comprise said LED lamp; and electrically interconnecting said plurality of light-emitting elements by one of:

interconnecting two light-emitting elements using a conductive member that interconnects the electrodes that are not directly bonded to the sub-mounts, thereby electrically interconnecting the electrodes of said two light-emitting elements that are not directly bonded to the sub-mounts; and interconnecting two light-emitting elements by mounting two said sub-mounts on a conductive plate, thereby electrically interconnecting the electrodes directly bonded to the sub-mounts.

* * * * *